(12) United States Patent
Finney et al.

(10) Patent No.: US 9,070,765 B2
(45) Date of Patent: Jun. 30, 2015

(54) SEMICONDUCTOR DEVICE WITH LOW ON RESISTANCE AND HIGH BREAKDOWN VOLTAGE

(71) Applicant: Infineon Technologies AG, Neubiberg (DE)

(72) Inventors: Adrian Finney, Villach (AT); Andrew Wood, St.Jakob im Rosental (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/760,200

(22) Filed: Feb. 6, 2013

(65) Prior Publication Data

US 2014/0217500 A1  Aug. 7, 2014

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/78 | (2006.01) |
| H01L 29/66 | (2006.01) |
| H01L 21/265 | (2006.01) |
| H01L 21/266 | (2006.01) |

(52) U.S. Cl.
CPC ...... *H01L 29/7816* (2013.01); *H01L 29/66681* (2013.01); *H01L 21/265* (2013.01); *H01L 21/26513* (2013.01); *H01L 21/266* (2013.01)

(58) Field of Classification Search
CPC ............ H01L 21/265; H01L 29/66681; H01L 29/7816
USPC ............................ 257/341, 330, 339; 438/286
See application file for complete search history.

(56) References Cited

U.S. PATENT DOCUMENTS

| 4,376,286 A | 3/1983 | Lidow et al. |
| 5,973,361 A | 10/1999 | Hshieh et al. |

(Continued)

FOREIGN PATENT DOCUMENTS

| DE | 4309764 A1 | 9/1994 |
| DE | 4435458 A1 | 4/1996 |

(Continued)

OTHER PUBLICATIONS

Criscione, et al. "STripFET V: New Low Voltage Power MOSFET technology." PCIM China Conference, 2008. p. 1-5.

*Primary Examiner* — Howard Weiss
(74) *Attorney, Agent, or Firm* — Murphy, Bilak & Homiller, PLLC

(57) ABSTRACT

A semiconductor device includes an epitaxial layer of semiconductor material of a first conductivity type, a body region of a second (opposite) conductivity type extending into the epitaxial layer from a main surface of the epitaxial layer, a source region of the first conductivity type disposed in the body region, and a channel region extending laterally in the body region from the source region along the main surface. A charge compensation region of the second conductivity type can be provided under the body region which extends in a direction parallel to the main surface and terminates prior to a pn-junction between the source and body regions at the main surface, and/or an additional region of the first conductivity type which has at least one peak doping concentration each of which occurs deeper in the epitaxial layer from the main surface than a peak doping concentration of the device channel region.

28 Claims, 23 Drawing Sheets

(56) References Cited

U.S. PATENT DOCUMENTS

| | | | |
|---|---|---|---|
| 6,228,719 B1 | 5/2001 | Frisina et al. | |
| 6,992,353 B1 | 1/2006 | Wu | |
| 7,732,862 B2 * | 6/2010 | Loechelt | 257/339 |
| 7,799,640 B2 * | 9/2010 | Parsey et al. | 438/268 |
| 7,939,897 B2 * | 5/2011 | Grivna et al. | 257/382 |
| 7,968,412 B2 | 6/2011 | Battiato et al. | |

FOREIGN PATENT DOCUMENTS

| | | |
|---|---|---|
| DE | 19534154 A1 | 3/1997 |
| DE | 19818299 A1 | 11/1999 |
| DE | 19922187 A1 | 11/2000 |
| DE | 10355588 B4 | 6/2006 |
| EP | 0779665 A2 | 6/1997 |

* cited by examiner

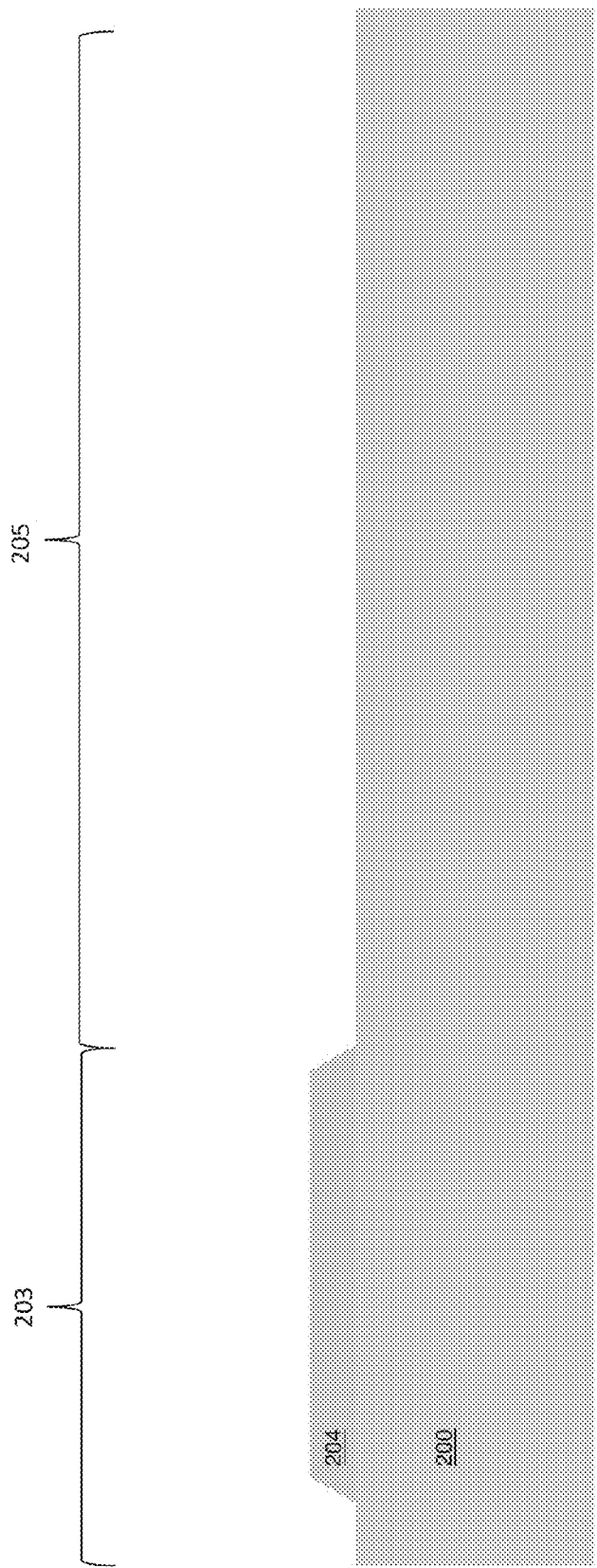

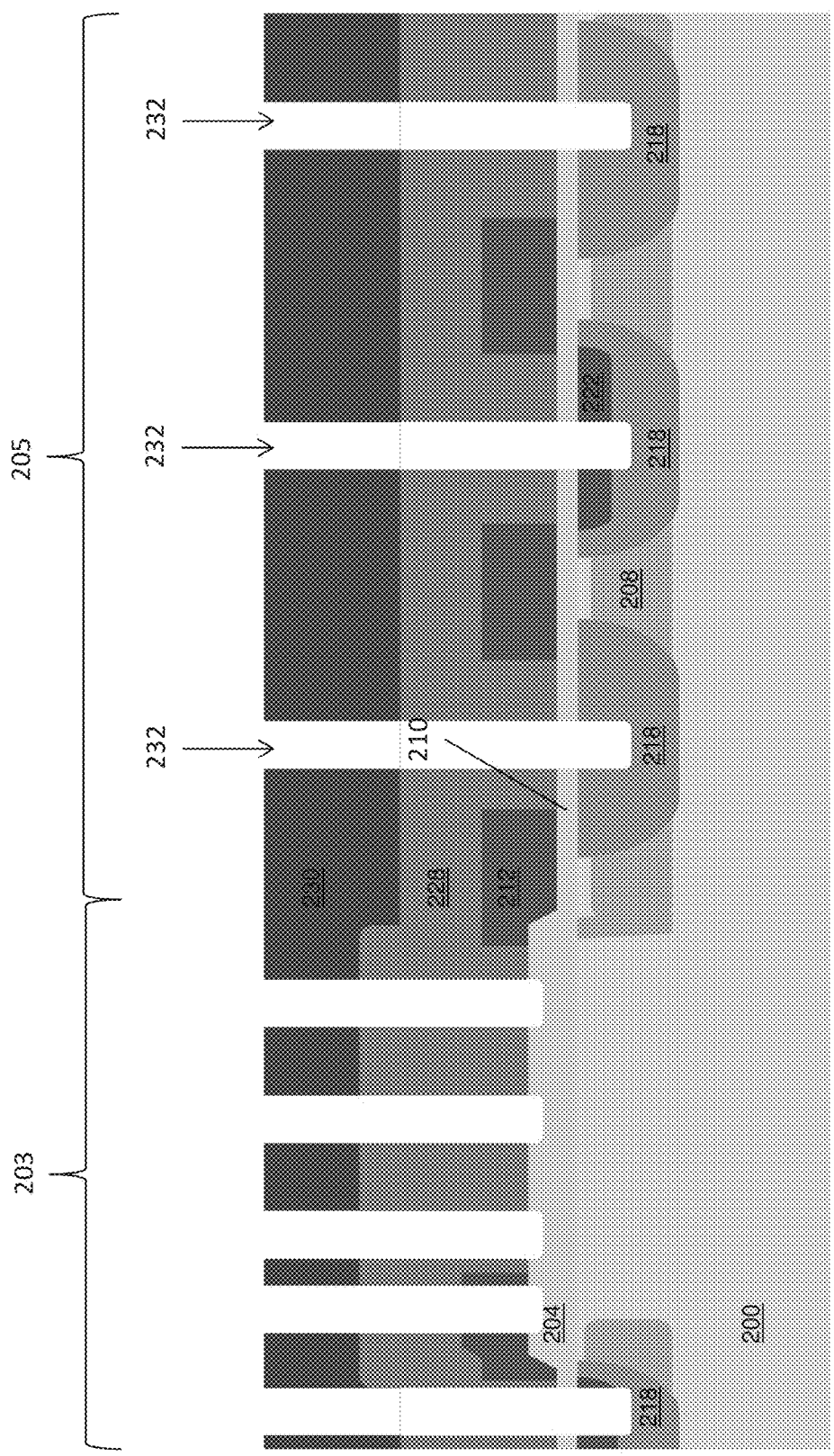

SEMICONDUCTOR DEVICE WITH LOW ON RESISTANCE AND HIGH BREAKDOWN VOLTAGE

TECHNICAL FIELD

The instant application relates to semiconductor devices, and more particularly to semiconductor devices with low on resistance and high breakdown voltage.

BACKGROUND

Planar DMOS (double-diffused metal-oxide-semiconductor) technologies provide low-cost and simple integration of on-chip IC (integrated circuit) control circuitry. However, planar DMOS technologies tend to have a relatively high on resistance (Ron). Several approaches have been taken to reduce Ron of planar DMOS devices. For example, some planar DMOS technologies employ charge compensation implants which deplete out to form a charge compensation region which largely supports most of the electric field during the off-state and hence mostly determines the device breakdown voltage. Increasing breakdown voltage in this way allows for shorter channel lengths because the body region no longer supports most of the breakdown voltage, and greater doping in the drift/channel region of the device to reduce Ron. However, the resulting charge compensation structures cause threshold voltage (Vth) control and avalanche problems and do not reduce Ron as far as technically possible. Conventionally a polysilicon resist mask has been used to pattern deep and medium charge compensation implants. This process flow has several disadvantages.

For example, the subsequent surface body implant is also masked by the same polysilicon. The entire implant stack is then driven by a body diffusion (annealing) process. After processing, the body concentration in the channel region is determined by a combination of the body implant and poorly controlled charge compensation implant tails generated by non-vertical sidewalls. This results in a wide Vth distribution and poor Vth matching between multiple DMOS devices, for example between a DMOS device and a DMOS current sense cell. DMOS current sense cells are designed to generate a fraction of the normal DMOS current, but poor Vth control and hence poor matching makes current sense cells less accurate especially at low currents.

Also, large geometries are typically used in conventional DMOS technologies, resulting in a high Ron. To achieve charge balance, relatively wide charge compensation implants between the polysilicon gates must be balanced with correspondingly wide gate lengths. This combination also requires deep charge compensation implants, necessitating a thick poorly-controlled resist which also requires wide geometries.

Breakdown occurs under the charge compensation regions. The charge compensation regions are disposed under the entire body region, resulting in some avalanche current flowing under the source region. An intrinsic parasitic bipolar transistor is triggered when sufficient avalanche current flows laterally underneath the source, thereby restricting the maximum avalanche current.

Some conventional approaches use a so-called JFET (junction field-effect transistor) implant in the drift/drain region of a DMOS device to reduce Ron. However, the lack of charge compensation implants means that the JFET implant must be very shallow to avoid reducing the breakdown voltage of the device. The best Ron/breakdown voltage tradeoff is conventionally obtained by placing the peak pre-body JFET implant at or near the silicon surface and gradually reducing the concentration deeper into the silicon. This is typically achieved by implanting the JFET implant close to the silicon surface. However, applying the JFET implant near the silicon surface counter-dopes the body implant at the surface to some extent. This results in a Vth which is influenced by an additional implant, increasing the Vth distribution. This is particularly problematic when a DMOS current sense cell is included in the design. DMOS current sense cells are designed to generate a fraction of the normal DMOS current, but poor Vth control and hence matching makes current sense cells less accurate especially at low currents.

Furthermore, a JFET implant is not easily added to a conventional DMOS process flow with wide charge compensation regions because the higher doping produced by the JFET region necessitates narrower gate lengths to maintain the breakdown voltage. This is incompatible with the thick poorly-controlled resist required for the deep charge compensation implants described above.

SUMMARY

According to the embodiments described herein, charge compensation regions can be implanted through the source/body contact hole of a DMOS or other semiconductor device without degrading the device characteristics, such as threshold voltage. These implants generate a region which supports most of the electric field during the off-state, and hence mostly determines the breakdown voltage. The presence of a charge compensation region in general makes it possible to realize so-called JFET implant(s) much deeper in the DMOS drain/drift region than would otherwise be possible. The JFET implant(s) increase the doping concentration in a larger region, yielding a lower on resistance. The JFET implant(s) can be placed deep enough below the silicon surface so that the on-state channel is not affected, characteristics such as Vth are unaltered, and triggering of the intrinsic parasitic bipolar transistor is avoided.

According to an embodiment of a semiconductor device, the device comprises an epitaxial layer of semiconductor material of a first conductivity type having a main surface, a body region of a second conductivity type opposite the first conductivity type extending into the epitaxial layer from the main surface, a source region of the first conductivity type disposed in the body region, and a channel region extending laterally in the body region from the source region along the main surface of the epitaxial layer. The device further comprises a charge compensation region of the second conductivity type disposed under the body region and an additional region of the first conductivity type disposed in the epitaxial layer adjacent the body region. The additional region has at least one peak doping concentration, each of which occurs deeper in the epitaxial layer from the main surface than a peak doping concentration of the channel region.

According to an embodiment of a method of manufacturing a semiconductor device, the method comprises: forming an epitaxial layer of semiconductor material of a first conductivity type having a main surface; forming a body region of a second conductivity type opposite the first conductivity type which extends into the epitaxial layer from the main surface; forming a source region of the first conductivity type in the body region; forming a channel region which extends laterally in the body region from the source region along the main surface of the epitaxial layer; forming a charge compensation region of the second conductivity type under the body region; and forming an additional region of the first conductivity type in the epitaxial layer adjacent the body region, the additional region having at least one peak doping concentration, each of which occurs deeper in the epitaxial layer from the main surface than a peak doping concentration of the channel region.

According to another embodiment of a semiconductor device, the device comprises an epitaxial layer of semiconductor material of a first conductivity type having a main surface, a body region of a second conductivity type opposite the first conductivity type extending into the epitaxial layer from the main surface, a source region of the first conductivity type disposed in the body region, and a groove extending from the main surface of the epitaxial layer through the source region into the body region. The groove is narrower than the body region. The device further comprises a charge compensation region of the second conductivity type disposed under the body region in alignment with the groove. The charge compensation region extends in a direction parallel to the main surface of the epitaxial layer and terminates prior to a pn-junction between the source region and the body region at the main surface.

According to another embodiment of a method of manufacturing a semiconductor device, the method comprises: forming an epitaxial layer of semiconductor material of a first conductivity type having a main surface; forming a body region of a second conductivity type opposite the first conductivity type which extends into the epitaxial layer from the main surface; forming a source region of the first conductivity type in the body region; forming a groove extending from the main surface of the epitaxial layer through the source region into the body region, the groove being narrower than the body region; and forming a charge compensation region of the second conductivity type under the body region in alignment with the groove, the charge compensation region extending in a direction parallel to the main surface of the epitaxial layer and terminating prior to a pn-junction between the source region and the body region at the main surface.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

Described next are embodiments of a DMOS semiconductor device having low on-resistance (Ron) and high breakdown voltage (BVdss). The device has charge compensation columns which can be implanted through the source/body contact hole or formed using conventional approaches. These implants generate a region which supports most of the electric field during the off-state of the device, and hence mostly determine the breakdown voltage. The presence of the charge compensation regions makes it possible to realize so-called JFET implants much deeper in the drift/drain region of the device than would otherwise be possible. The JFET implants increase the doping concentration in a larger region of the device, yielding a lower Ron. The JFET implants can be placed deep enough below the silicon surface so that the on-state channel is not affected so that characteristics of the device such as Vth are unaltered.

Figure 1:
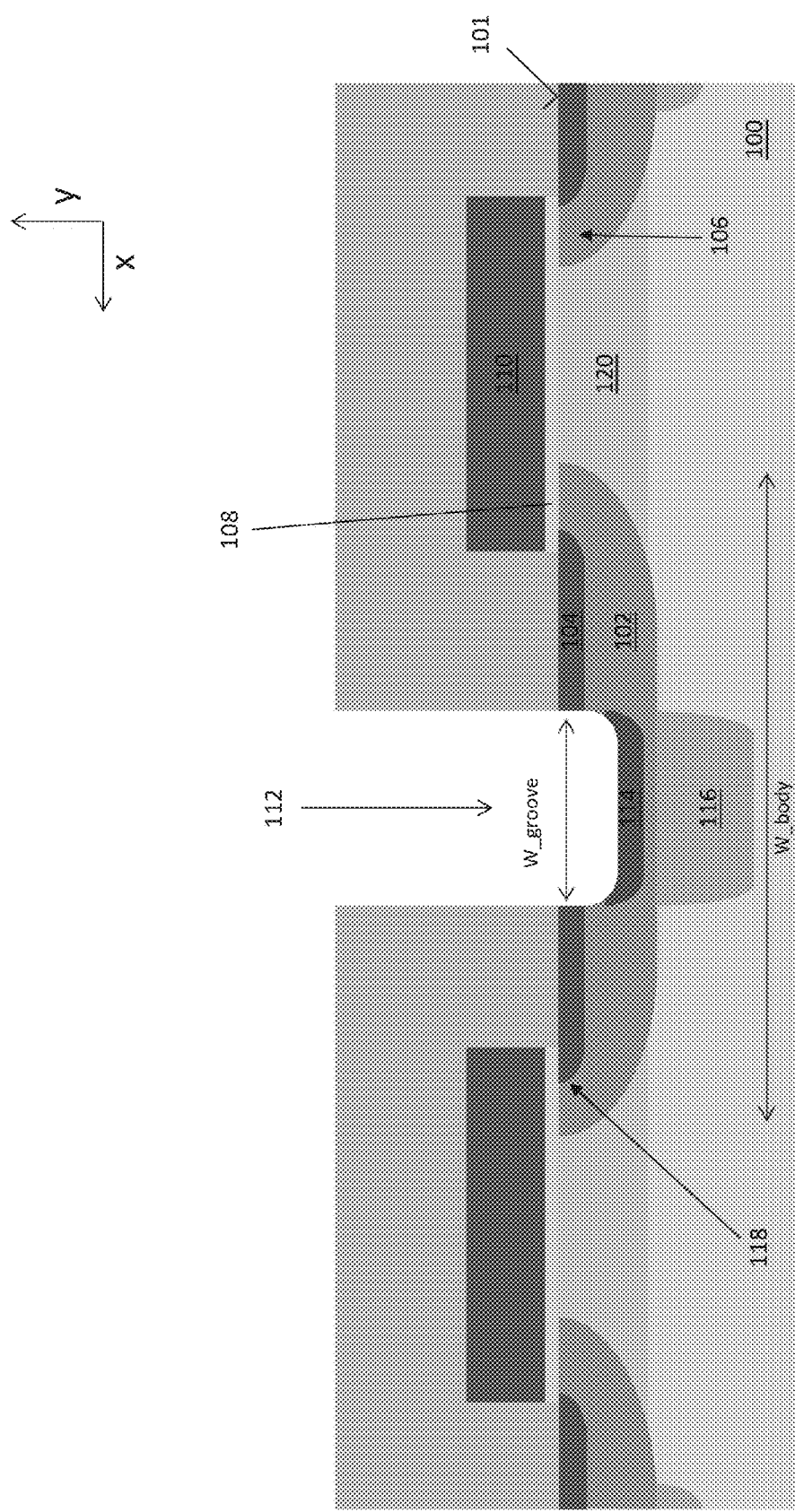
FIG. 1 illustrates a cross-sectional view of an embodiment of a semiconductor device having a charge compensation region aligned with a groove in the body region, and a JFET region in the drain/drift region of the device.

FIG. 1 illustrates a cross-sectional view of one embodiment of the DMOS semiconductor device prior to source/body contact formation. According to this embodiment, the semiconductor device comprises an epitaxial layer 100 of semiconductor material e.g. silicon of a first conductivity type having a main surface 101. The upper part of the epitaxial layer 100 is shown in FIG. 1, and the underlying support substrate e.g. with a drain contact is out of view. A body region 102 of a second conductivity type opposite the first conductivity type extends into the epitaxial layer 100 from the main surface 101. In one case, the epitaxial layer 100 is doped n-type and the body region 102 is doped p-type. In another case, the doping types are reversed.

In both cases, a source region 104 of the first conductivity type is disposed in the body region 102 and a channel region 106 extends laterally in the body region 102 from the source region 104 along the main surface 101 of the epitaxial layer 100. The channel region 106 is controlled by a gate structure which includes a gate dielectric 108 such as SiO2 on the main surface 101 of the epitaxial layer 100 and a gate conductor 110 such as polysilicon on the gate dielectric 108 so that the gate conductor 110 is insulated from the underlying epitaxial layer 100.

A groove 112 extends from the main surface 101 of the epitaxial layer 100 through the source region 104 into the body region 102. The groove 112 is narrower (W_groove) than the body region 102 (W_body), and is subsequently filled with a conductive material to form a source/body contact. The source/body contact is not shown in FIG. 1. A heavily doped body contact region 114 may be formed in the body region 102 at the bottom of the groove 112 to improve contact with the body region 102.

A charge compensation region 116 of the opposite conductivity type to the epitaxial layer 100 is disposed under the body region 102. According to this embodiment, the charge compensation region 116 is aligned with the groove 112, extending in a direction (x) parallel to the main surface 101 of the epitaxial layer 100 and terminating prior to a pn-junction 118 between the source region 104 and the body region 102 at the main surface 101. The charge compensation region 116 is formed by implanting a dopant species of the same conductivity as the body region 102 through the groove 112 and into the epitaxial layer 100 under the body region 102. For example, a single or multiple charge compensation regions 116 can be implanted through the groove 112 after etching of the groove 112. Doing so enables the use of grooves (contact holes) 112 which are narrower (W_groove) than the body region 102 (W_body). This allows the combination of narrow shallow charge compensation implants with narrow gates, offering a much lower Ron.

The groove 112 can be etched after most of the thermal treatment of the body region 102 is performed. As used herein, the term 'thermal treatment' can refer to any type of elevated temperature processing including annealing or diffusion. Annealing is a high-temperature process which activates implanted dopant species. Diffusion is a high-temperature process which activates and redistributes implanted dopant species. By etching the groove 112 after most of the thermal treatment of the body region 102 is performed, the charge compensation implants are preferentially not driven under the source region 104 or into the channel region 106. As such, the charge compensation region 116 can be formed away from the edge of the gate conductor 110 so that the implant tails from the charge compensation implantation process do not influence the device Vth; that is, the charge compensation region 116 does not extend under the gate conductor 110 in some embodiments. Such a device configuration reduces the spread of the Vth distribution and hence improves the Vth matching of current sense cells. The charge compensation implantation is also localized under the center of the body region 116 according to this embodiment. This avoids lateral current flow under the source region 104 during avalanche. This also avoids turn-on of the intrinsic parasitic bipolar transistor formed by the source region 104, body region 102, and epitaxial layer 100 (e.g. an NPN transistor in the case of a p-type body and n-type epitaxial/source), thereby increasing the avalanche current capability of the device.

The Ron of the DMOS semiconductor device can be reduced by forming an additional region 120 of the same conductivity type as the epitaxial layer 100 and the source region 104 in the epitaxial layer 100 adjacent the body region 102. This additional region 120 is also referred to herein as JFET region for ease of differentiation between other parts of the device. The JFET region 120 is provided between the main surface 101 of the epitaxial layer 100 and the charge compensation region 116. The JFET region 120 has at least one peak doping concentration each of which occurs deeper in the epitaxial layer 100 from the main surface 101 than a peak doping concentration of the channel region 106. Such a device configuration reduces Ron without affecting Vth or reducing BVdss. Since the charge compensation region 116 supports most of the electric field in the device off-state, the JFET region 120 can be formed much deeper than is conventionally done. As such, a lower Ron can be achieved for the same BVdss because a larger portion of the JFET region 120 is more heavily doped. The JFET region 120 can be formed deep enough to avoid significant influence of the surface doping in the body region 102, which avoids increasing the width of the Vth distribution in the DMOS device and current sense cell due to the influence of the JFET region 120 on the body region 102.

Figure 2:
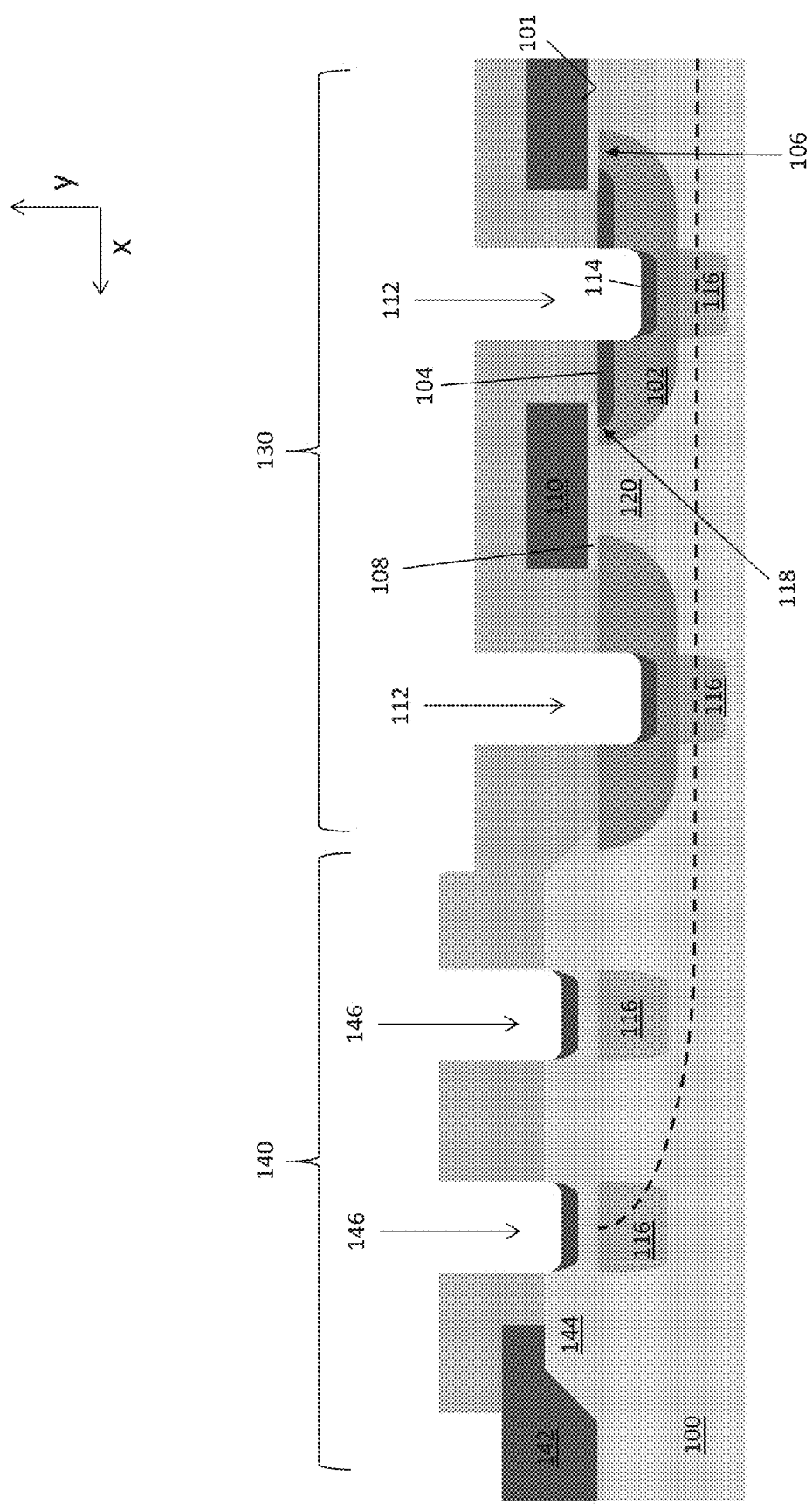
FIG. 2 illustrates a cross-sectional view of the semiconductor device of FIG. 1 in the edge region and active region of the device.

FIG. 2 illustrates a cross-sectional view of the DMOS semiconductor device which shows parts of both the active device region 130 and the edge region 140. Transistor cells and other device structures are formed in the active device region 130, and under the field oxide 144 the edge region 140 is devoid of the body and source regions 102, 104. A channel stop region 142 and a thick oxide 144 such as a field oxide are disposed on the main surface 101 of the epitaxial layer 100 in the edge region 140. The oxide 144 is thick in that it is significantly thicker than the gate oxide 108 e.g. by a factor of three or more. Grooves 146 extend into the thick oxide 144 toward the main surface 101 of the epitaxial layer 100. Additional charge compensation regions 116 of the same conductivity type as the body region 102 are disposed in the epitaxial layer 100 under and aligned with the grooves 146 in the thick oxide 144. Such a charge compensation construction brings the off-state depletion region to the main surface 101 of the epitaxial layer 100 in the edge region 140 as indicated by the dashed line in FIG. 2.

The device breakdown voltage BVdss depends on the charge balance of the doping in the charge compensation regions 116 and the surrounding background epitaxial doping. Accordingly, it is preferential for the charge compensation regions 116 to be surrounded with semiconductor material at the same concentration throughout the device. In the edge region, the off-state depletion region reaches the main surface 101 of the epitaxial layer 100 in the edge region 140 where the JFET implant is preferably omitted as shown in FIG. 2.

To achieve a high breakdown voltage, the average doping between the charge compensation regions 116 and the surrounding semiconductor material at the same equipotential line should be approximately equal. Any pattern which meets this requirement can be used. However, the edge of the thick oxide 144 can be difficult to control, so it is preferential to use a pattern which is independent of the absolute position of the thick oxide edge.

Figure 3:
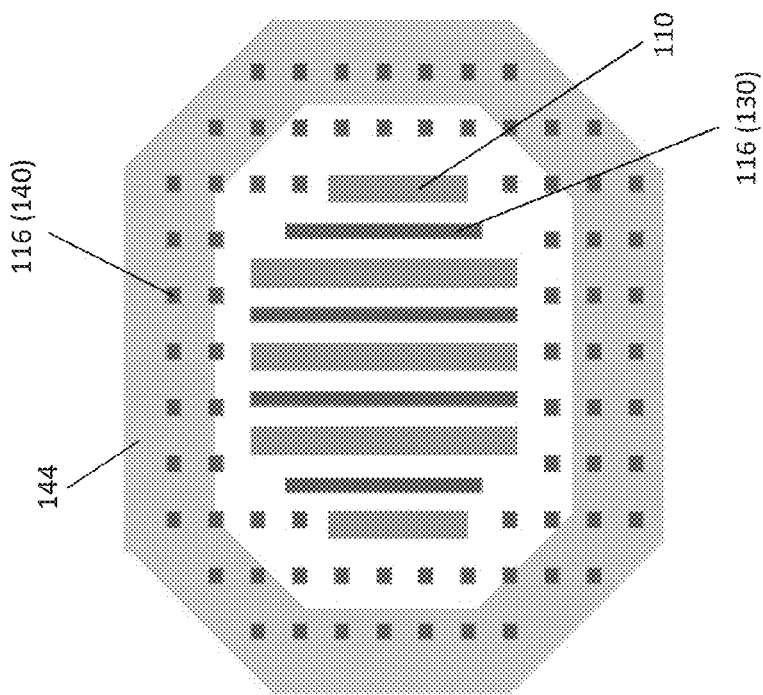
FIG. 3 illustrates a top-down plan view of the semiconductor device of FIGS. 1 and 2 according to an embodiment.

FIG. 3 illustrates a top-down plan view of the semiconductor device which shows the additional charge compensation regions 116 in the edge region 140 arranged in a cellular checkerboard pattern.

Figure 4:
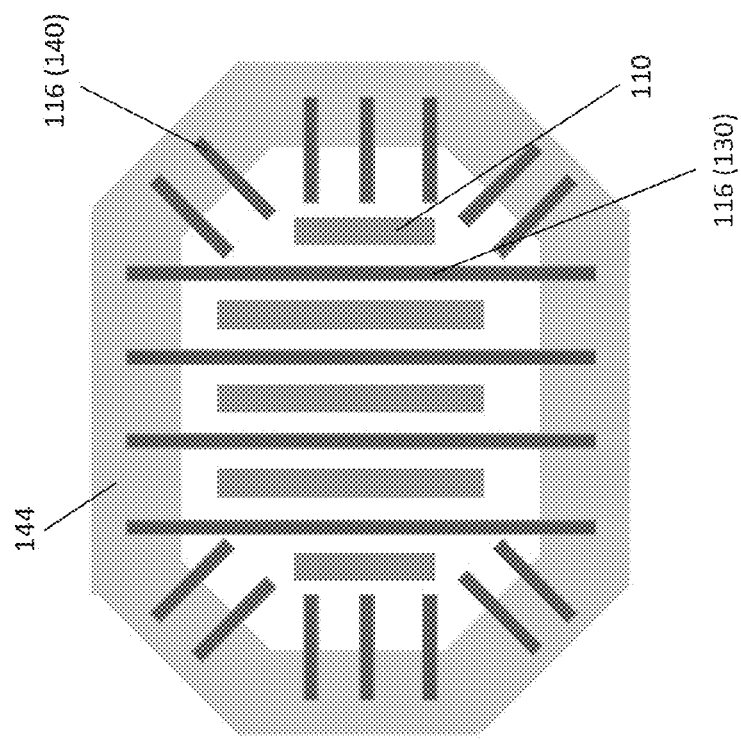
FIG. 4 illustrates a top-down plan view of the semiconductor device of FIGS. 1 and 2 according to another embodiment.

FIG. 4 illustrates a top-down plan view of the semiconductor device which shows the additional charge compensation regions 116 in the edge region 140 formed as stripes. The stripes 116 are disposed at an angle (e.g. 45° or 90°) with respect to the charge compensation regions 116 under the body regions 102 in the active area 130 of the device. In both embodiments illustrated in FIGS. 3 and 4, the additional charge compensation regions 116 provided in the edge region 140 of the DMOS semiconductor device are independent of the edge position of the thick oxide 144.

Figure 5A:
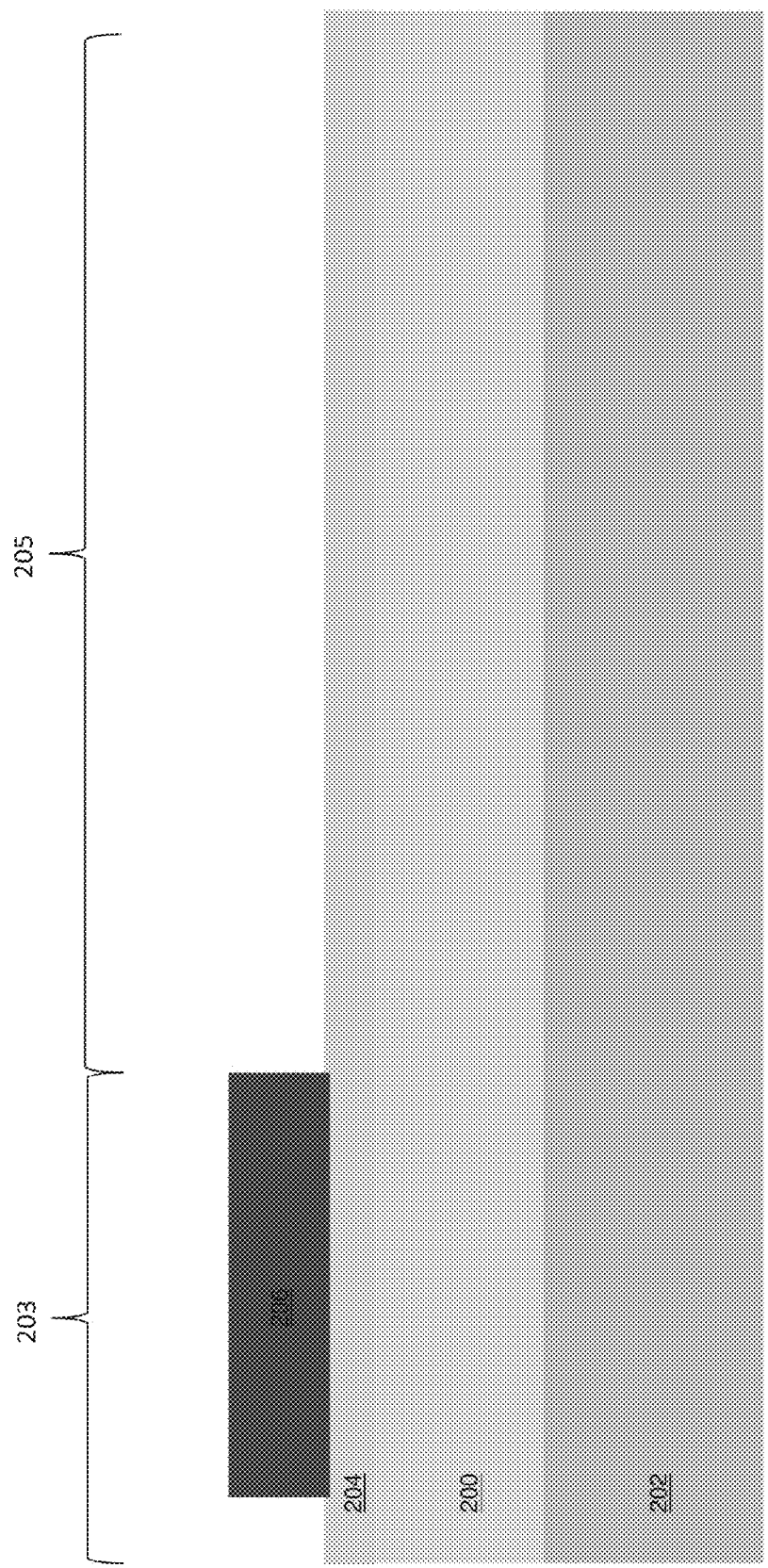
FIGS. 5A through 5R illustrate cross-sectional views of the semiconductor device of FIGS. 1 and 2 at different stages of a manufacturing process according to an embodiment.
Figure 5B:
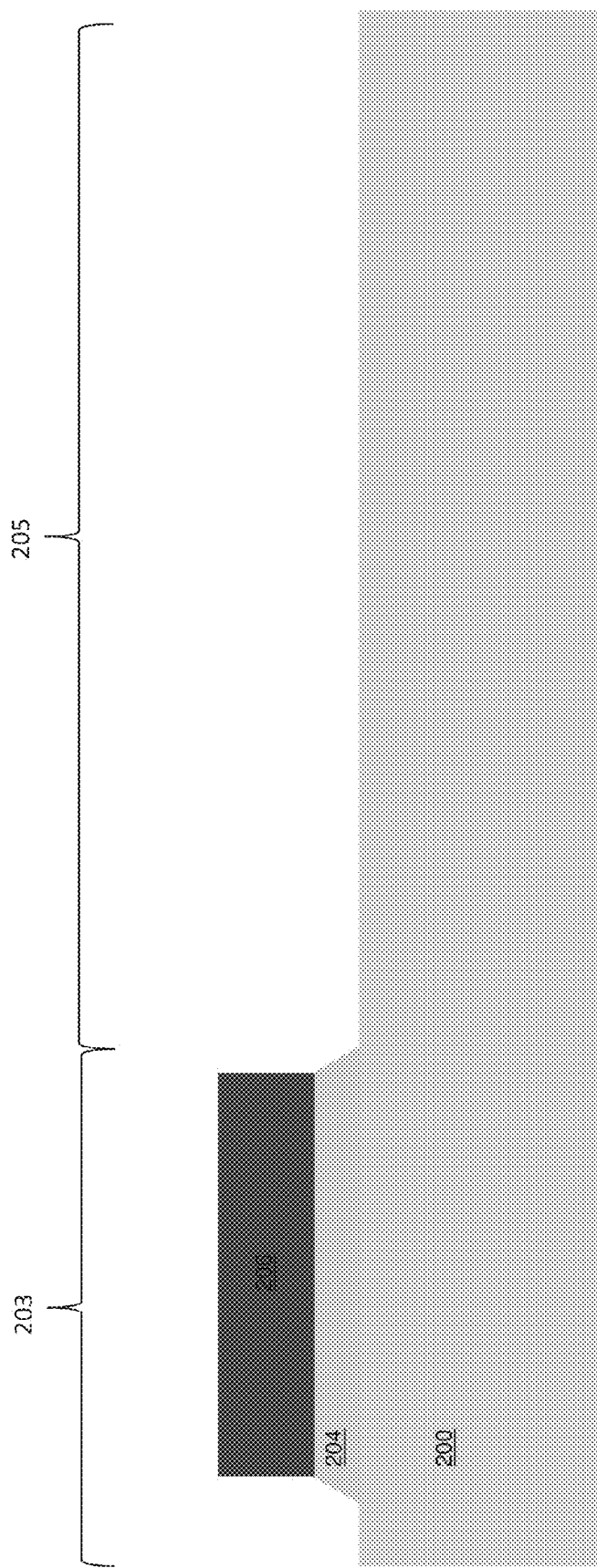
Figure 5D:
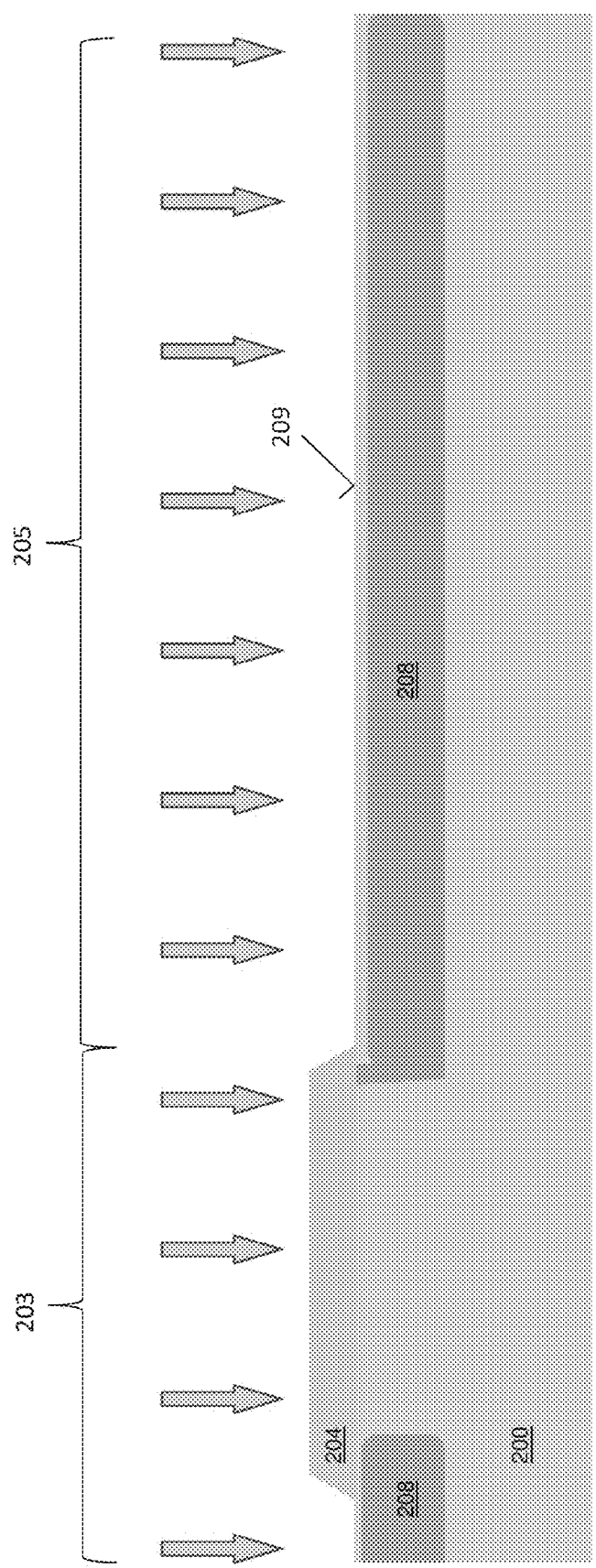
Figure 5E:
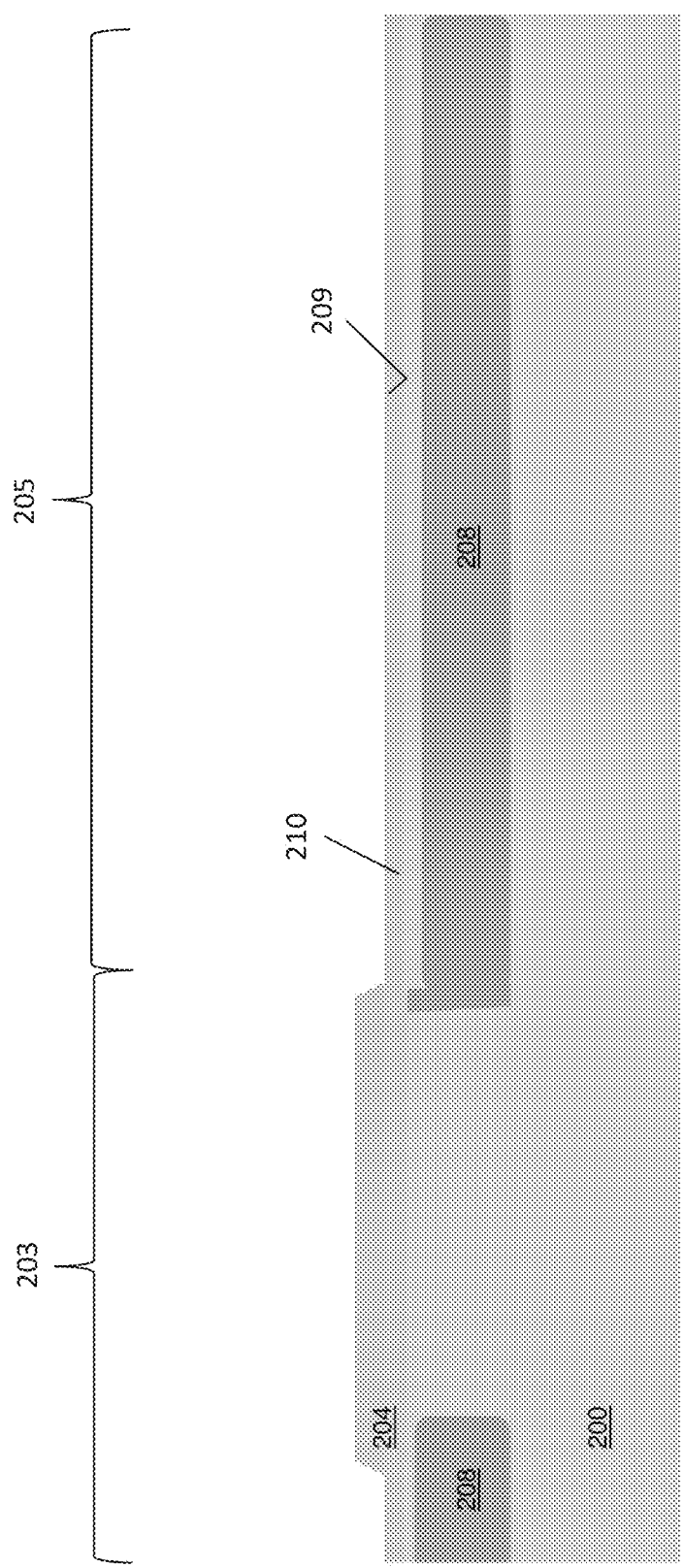
Figure 5F:
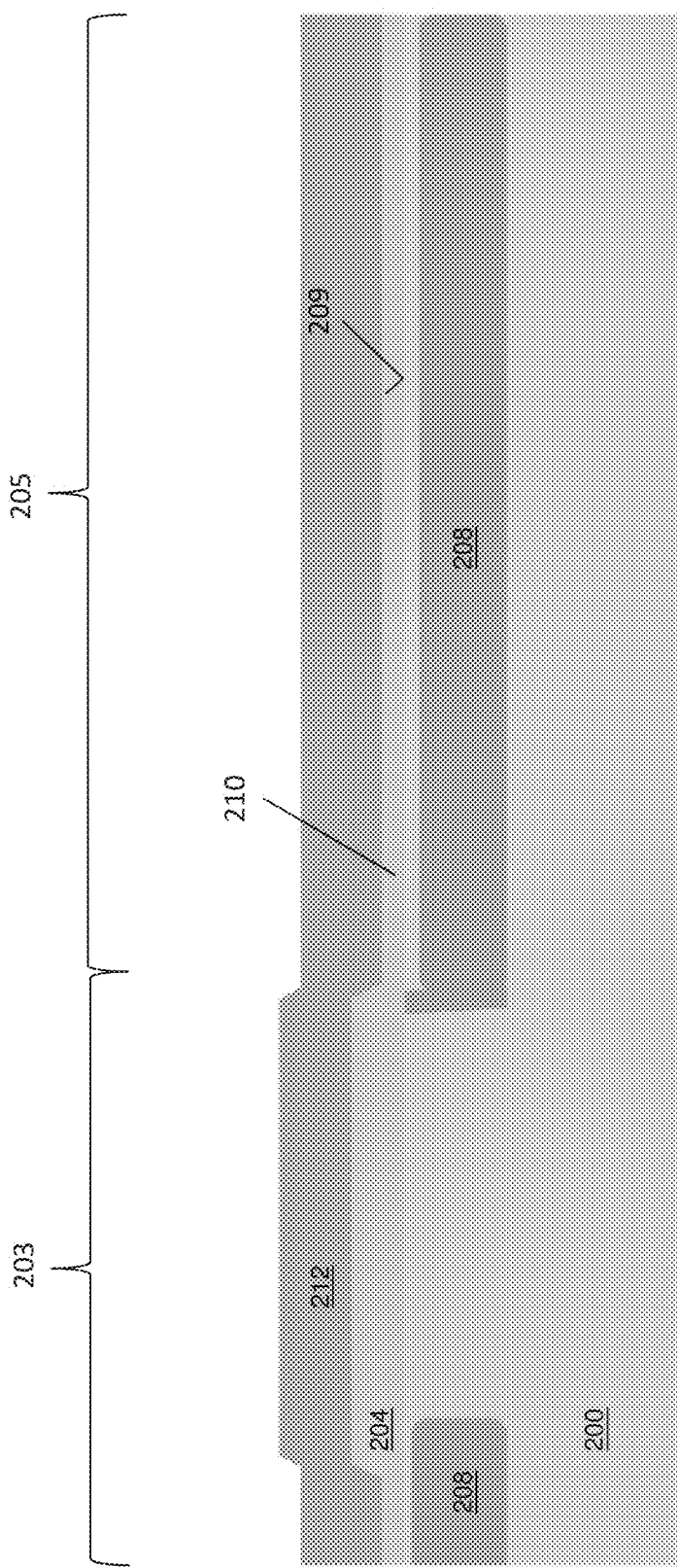
Figure 5G:
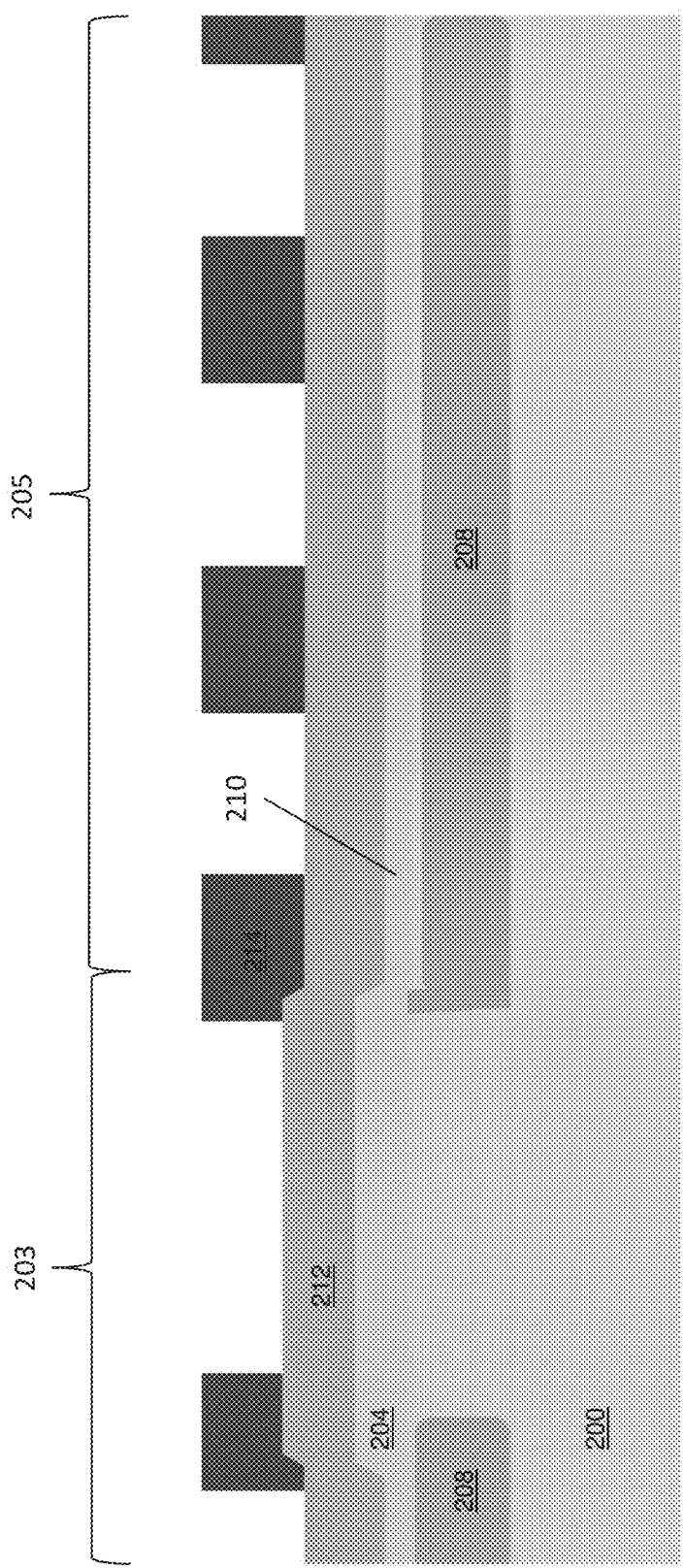
Figure 5H:
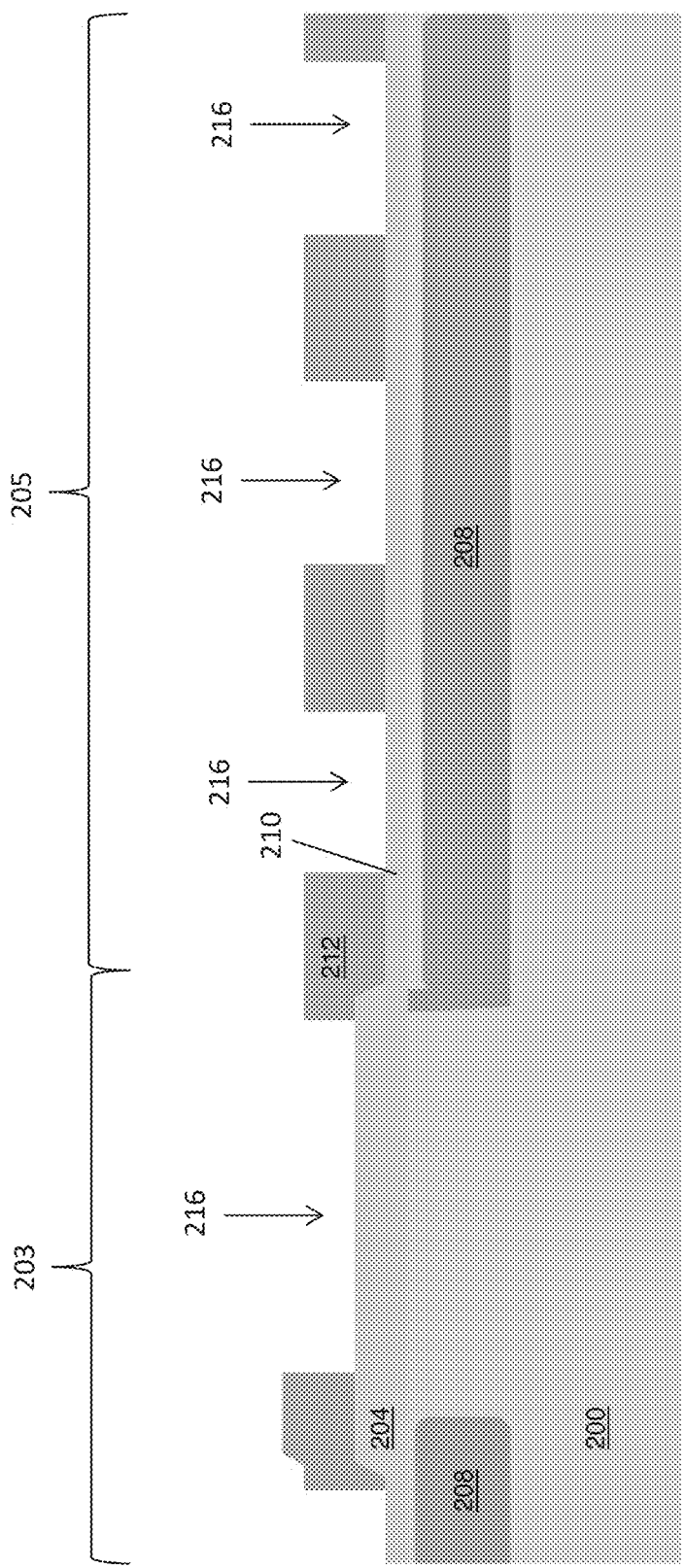
Figure 51:
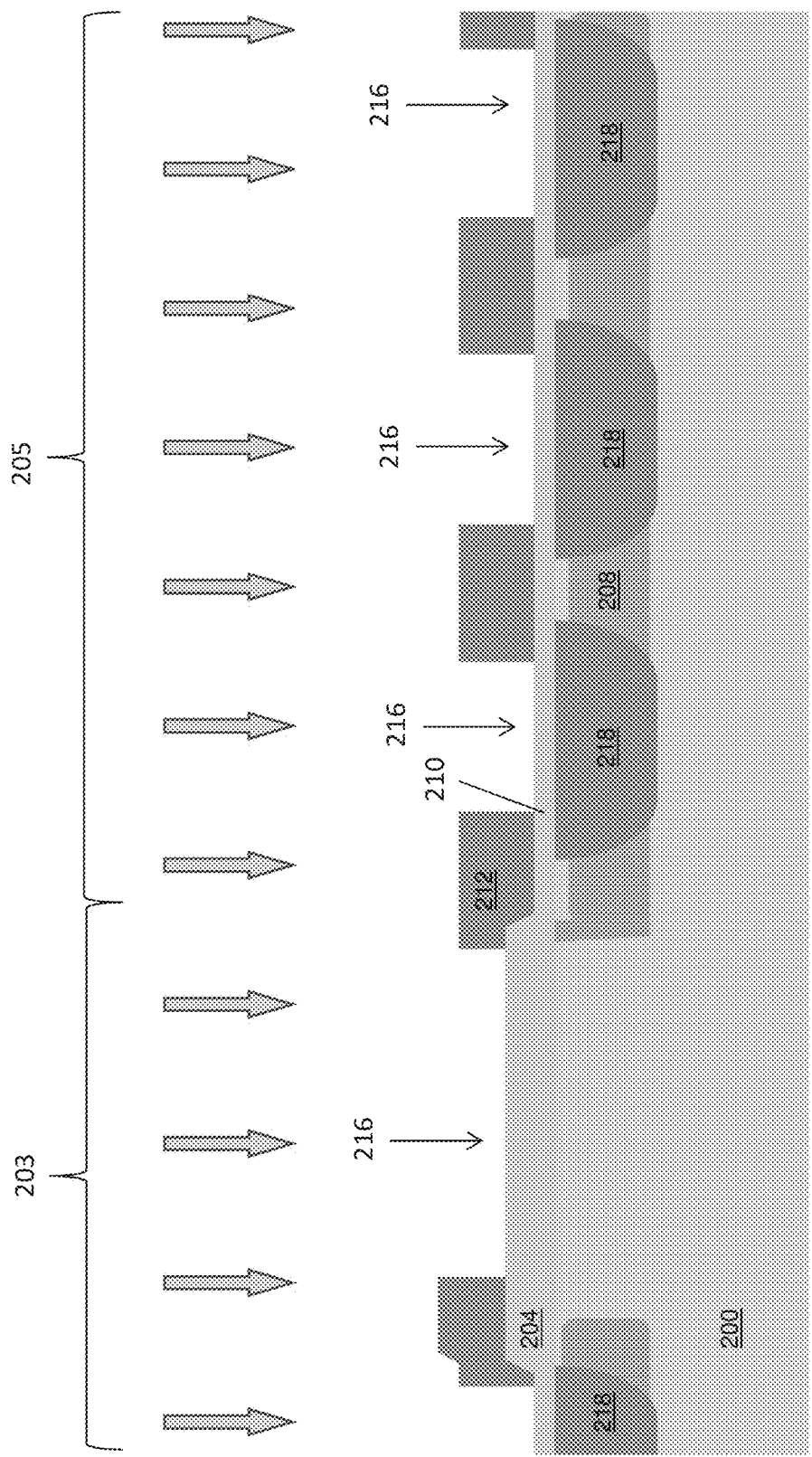
Figure 5J:
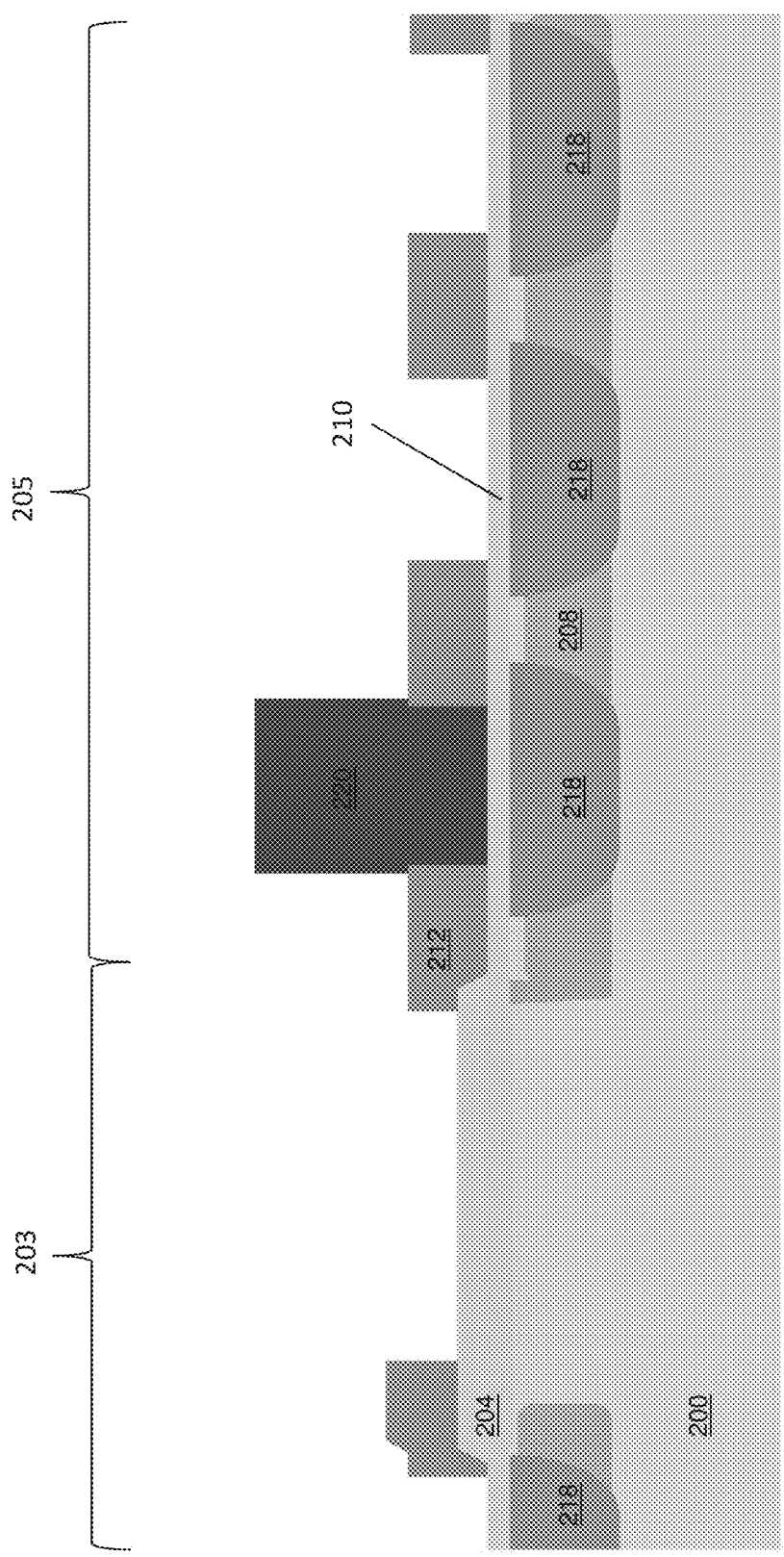
Figure 5K:
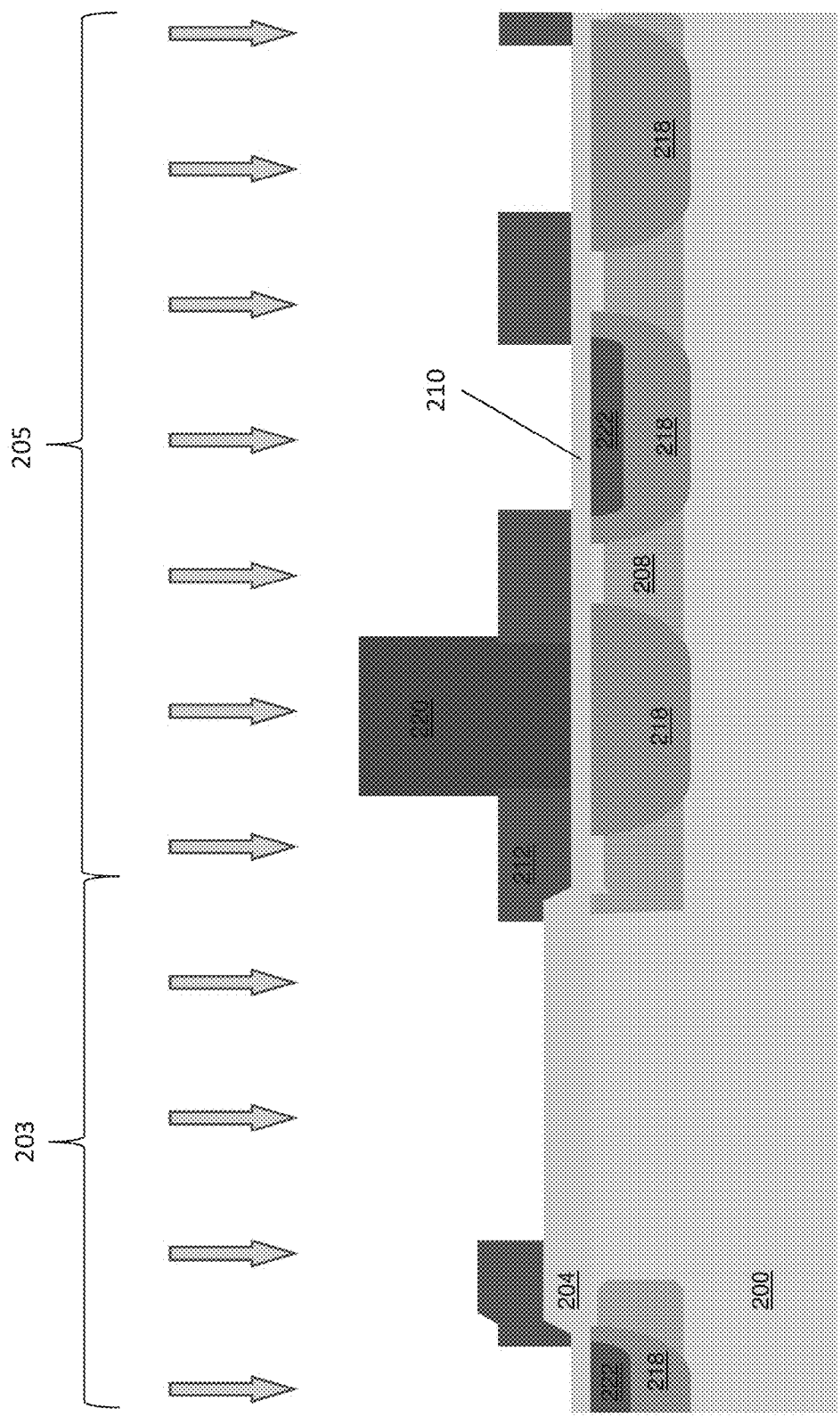
Figure 5L:
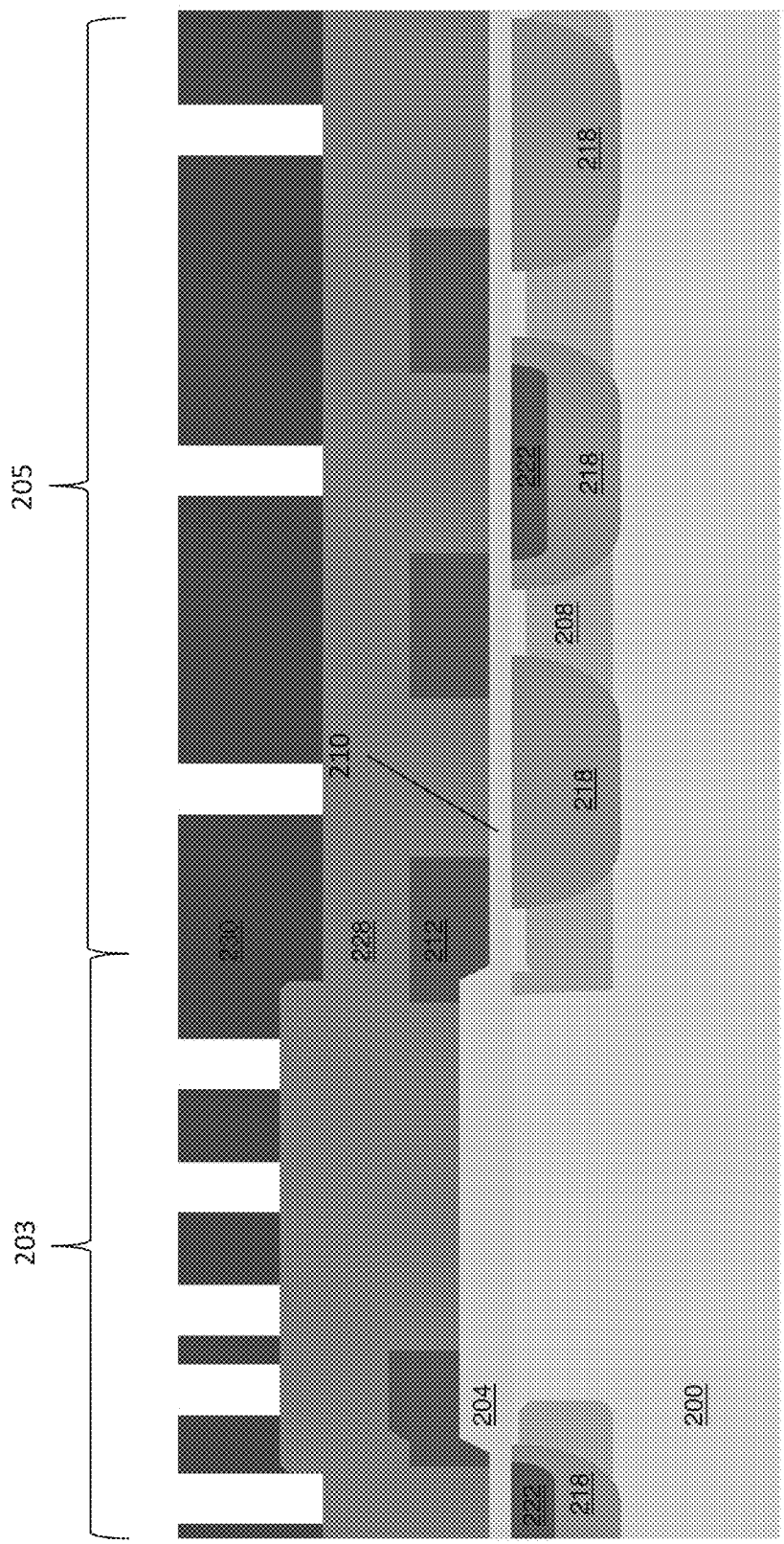
Figure 5N:
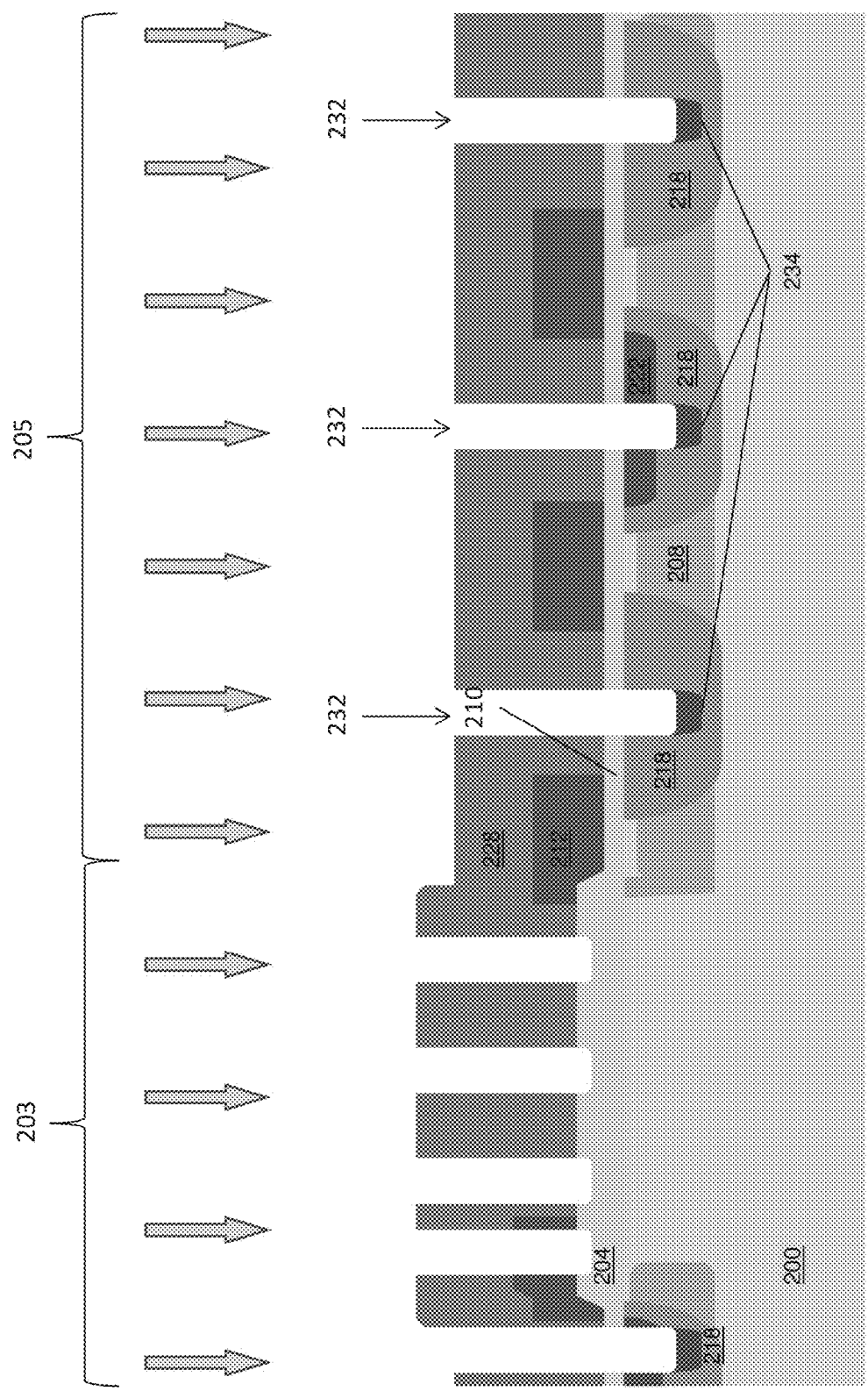
Figure 50:
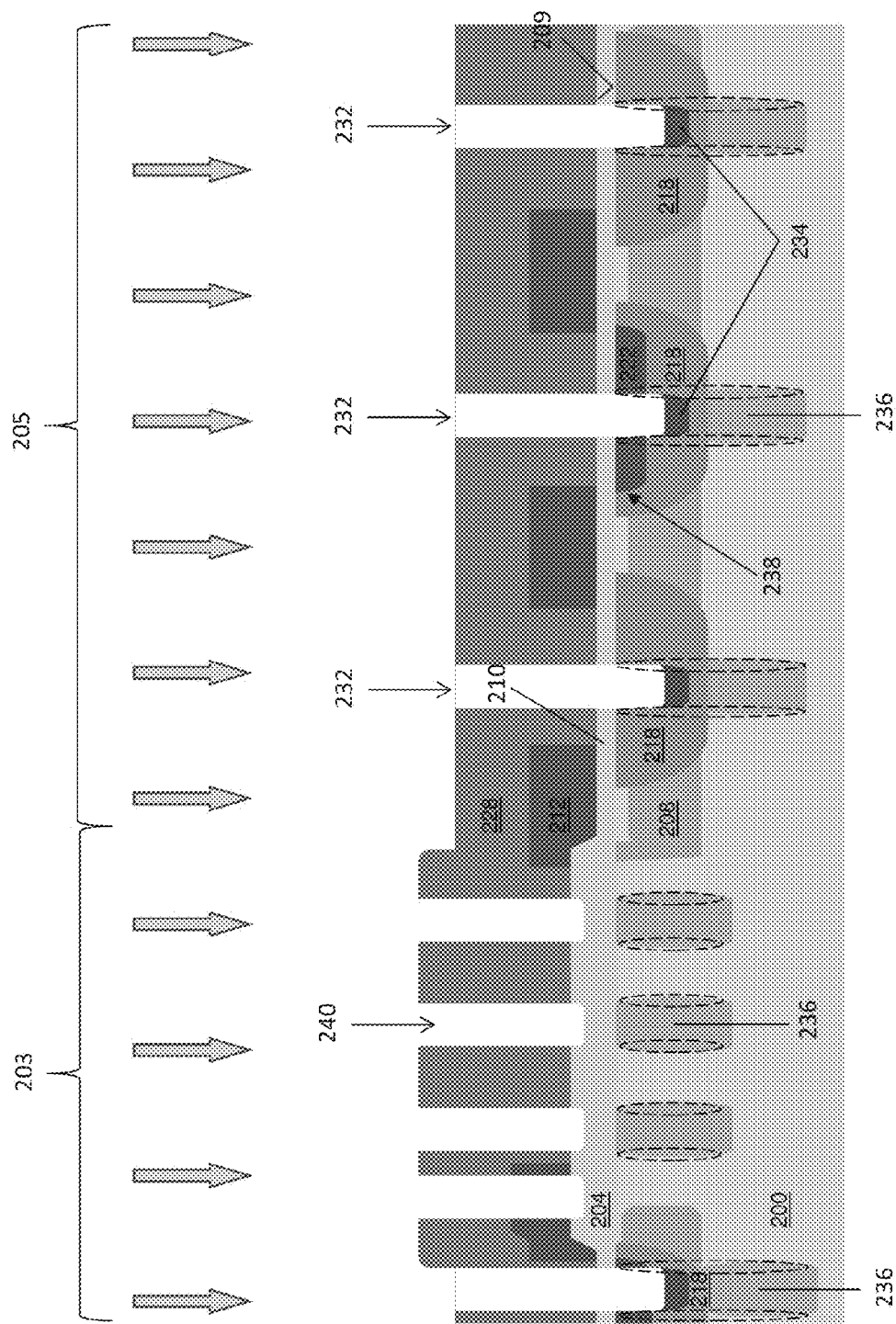
Figure 5P:
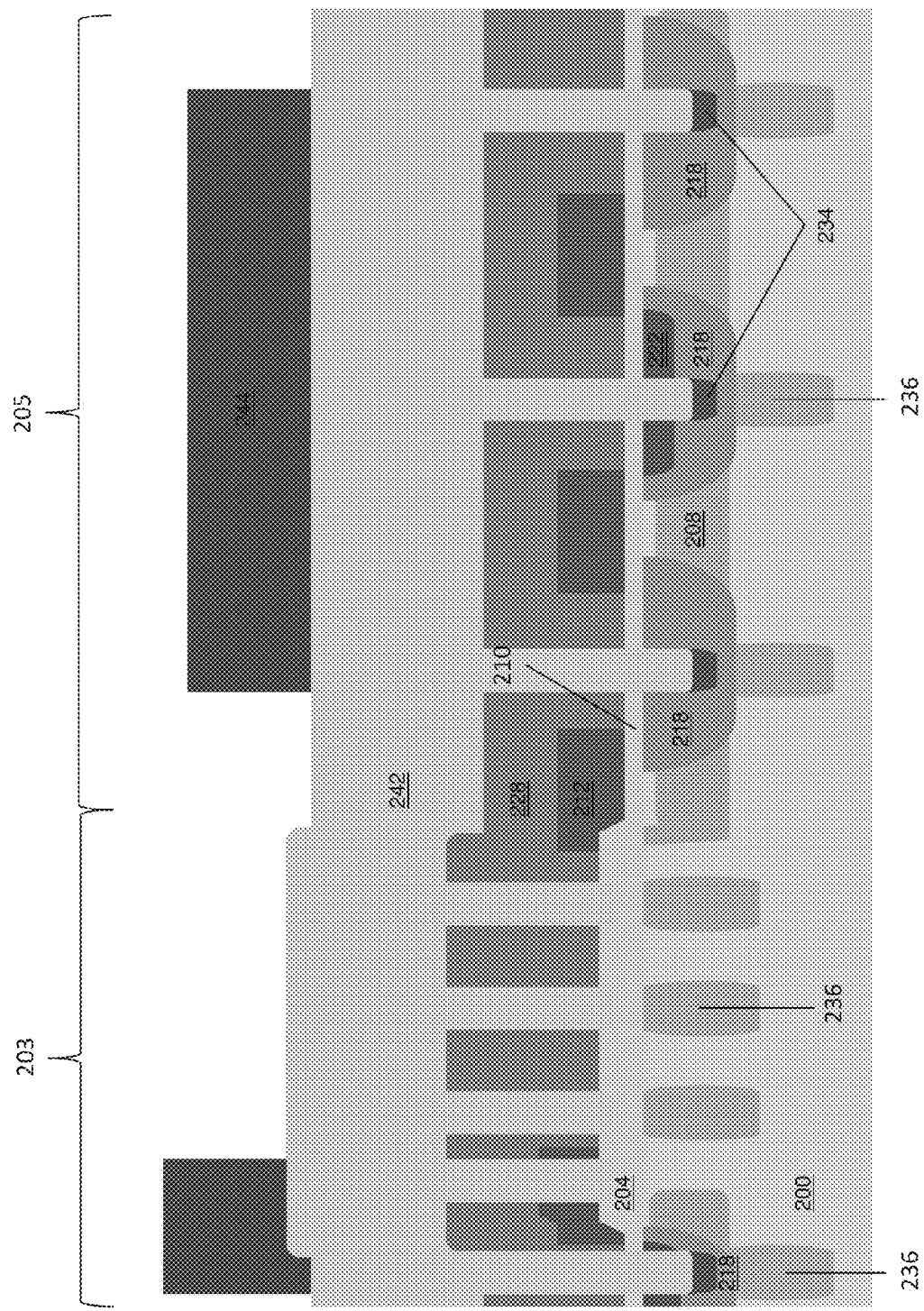
Figure 5Q:
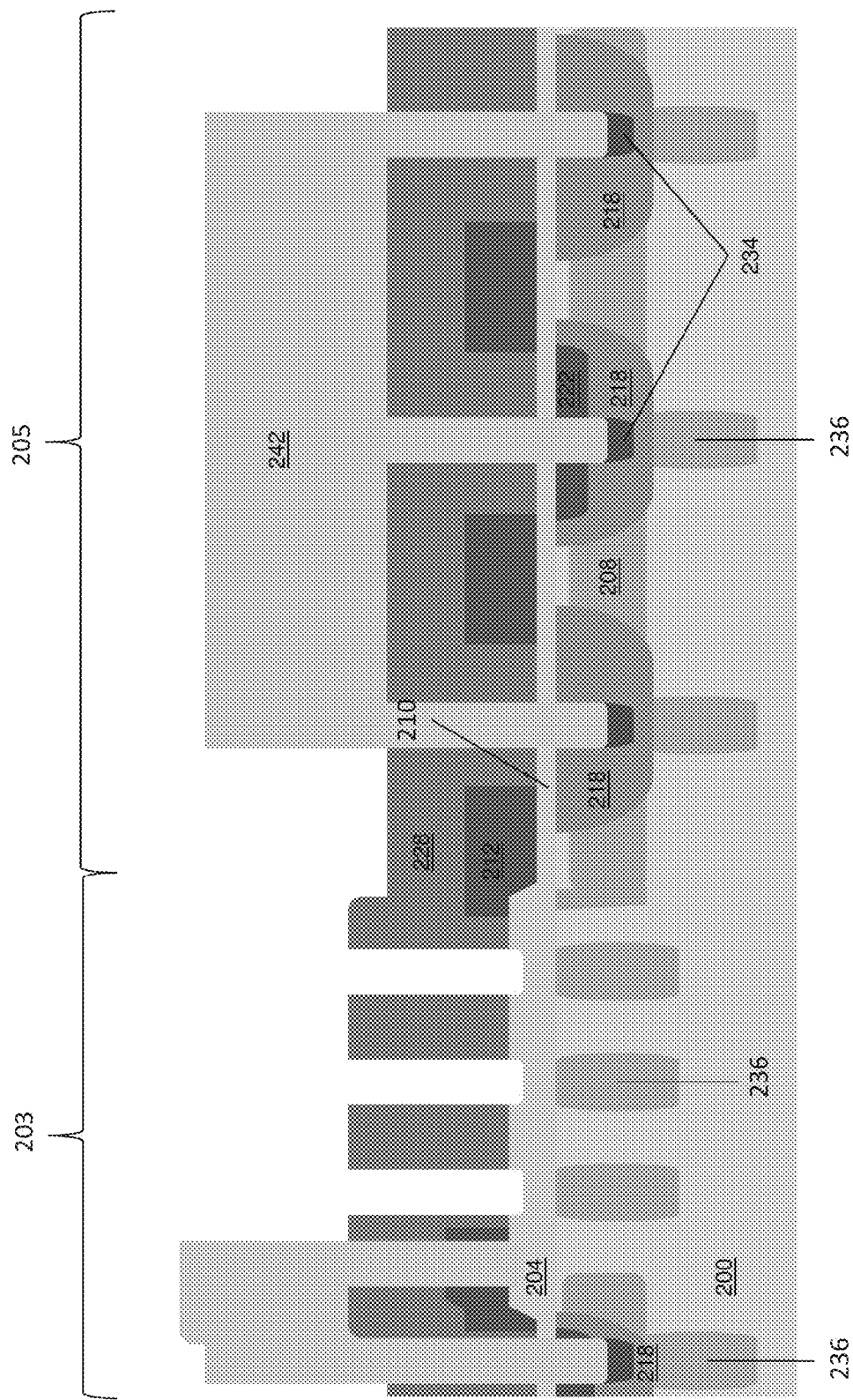
Figure 5R:
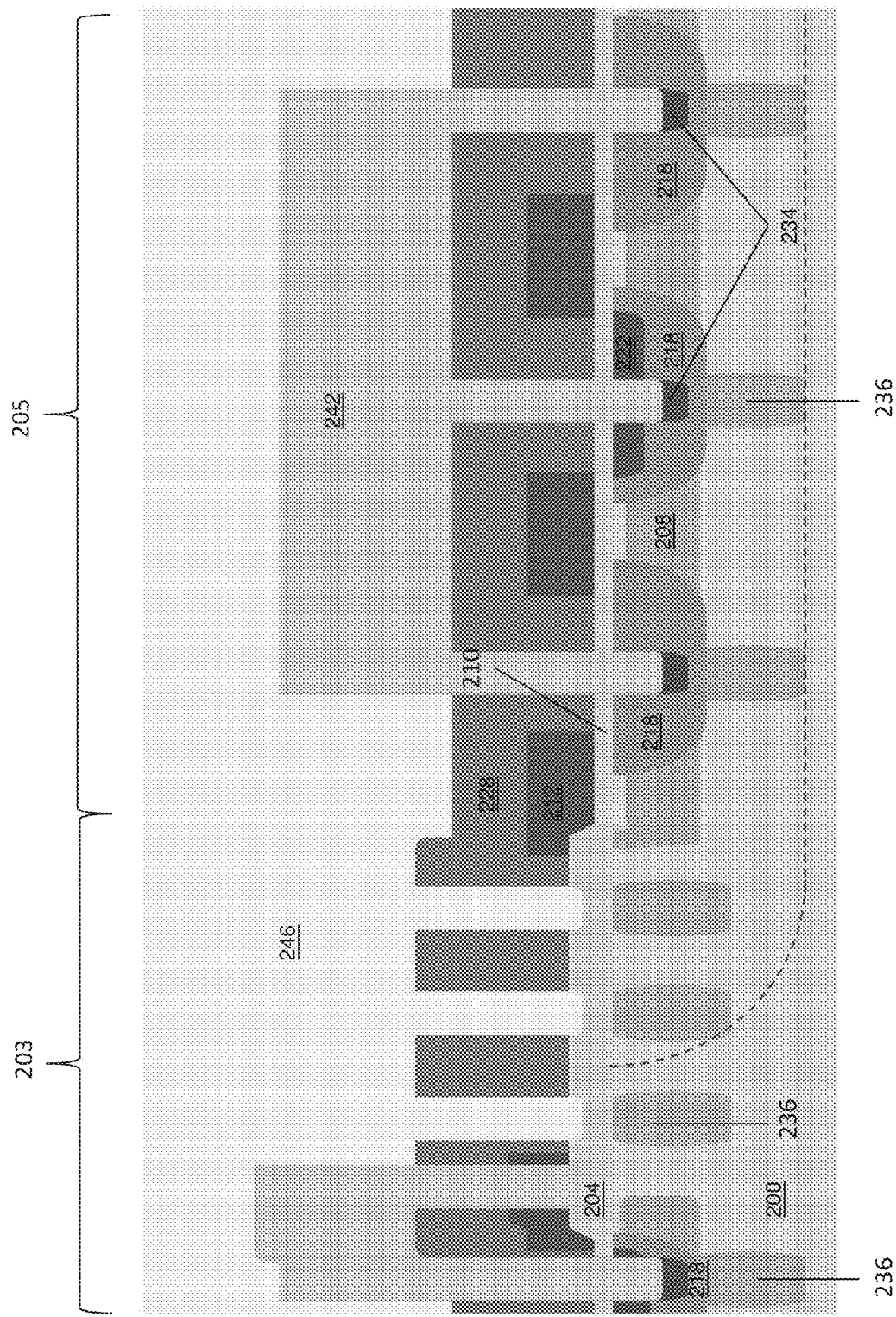

FIG. 5A through 5R illustrate an embodiment of a method of manufacturing the DMOS semiconductor device. Various conventional processes well known to those skilled in the art such as material deposition and removal, dopant implantation, annealing, etc. can be employed in the manufacture of the DMOS device, and therefore no further explanation is provided with regard to such processes.

FIG. 5A shows the device after an epitaxial layer 200 of doped semiconductor material such as n-type or p-type silicon is grown on a semiconductor substrate 202, a thick field oxide 204 is grown on the epitaxial layer 200, and a first resist mask 206 is deposited and patterned on the field oxide 204. The device has an edge region 203 protected by the first resist mask 206 and a DMOS cell region 205 covered by the field oxide 204 but not the first resist mask 206. The semiconductor substrate 202 is excluded from FIGS. 5B through 5R for ease of illustration.

FIG. 5B shows the semiconductor device after the portion of the field oxide 204 unprotected by the first mask 206 is removed in the DMOS cell region 205, e.g. by etching.

FIG. 5C shows the semiconductor device after the first mask 206 is removed, e.g. by etching.

FIG. 5D shows the semiconductor device after implantation of a JFET region 208 below the main surface 209 of the epitaxial layer 200. The JFET implants are represented as downward facing arrows in FIG. 5D. Each implanted JFET region 208 has the same dopant type as the epitaxial layer 200. For example, arsenic can be implanted into the epitaxial layer

200 to form the JFET regions 208 if the epitaxial layer 200 is n-type. In one embodiment, the JFET implant energy is relatively high, e.g. around 600 keV for a 40V device, so that the resulting JFET regions 208 do not reach the main surface 209 of the epitaxial layer 200 post diffusion. The field oxide 204 can be made thick enough, e.g. around 550 nm, and the JFET implantation energy can be made low enough so that the JFET implants do not penetrate the epitaxial layer 200 in regions where the field oxide 204 is present.

The JFET regions 208 have at least one peak doping concentration each of which occurs deeper in the epitaxial layer 200 from the main surface 209 than a peak doping concentration of the channel region which is subsequently formed. In one embodiment, a dopant species of the same conductivity type as the epitaxial layer 200 is implanted into the DMOS cell region 205 at an implantation energy sufficient to yield a single peak concentration level of the implanted dopant species deep enough below the main surface 209 of the epitaxial layer 200 so that the JFET regions 208 do not reach the main surface 209 after subsequent diffusion. In another embodiment, the diffusion of the JFET implants is sufficient to yield a single peak concentration level of the implanted dopant species at a depth below the main surface 209 of the epitaxial layer 200 so that the JFET regions 208 have the same doping profile above and below the single peak doping concentration level post diffusion.

FIG. 5E shows the semiconductor device after a gate oxide 210 is grown on the main surface 209 of the epitaxial layer 200 in the DMOS cell region 205 of the device. The thickness of the gate oxide 210 depends on the application in which the DMOS device is to be used. For example, a gate thickness of about 30 nm is typical. Other gate oxide thicknesses are possible.

FIG. 5F shows the semiconductor device after a gate conductor material 212 is formed on the gate oxide 210, e.g. by depositing polysilicon on the gate oxide 210.

FIG. 5G shows the semiconductor device after a second resist mask 214 is formed on the gate conductor material 212. The second mask 214 is patterned to define locations of the body regions.

FIG. 5H shows the semiconductor device after parts of the gate conductor material 212 unprotected by the second mask 214 are etched to form openings 216 in the gate conductor material 212, and after the second mask 214 is removed.

FIG. 5I shows the semiconductor device during implantation of the body regions 218 through the openings 216 in the gate conductor material 212. A dopant species of the opposite conductivity as the epitaxial layer 200 is used to form the implanted body regions 218. The body region implants are indicated by downward facing arrows in FIG. 5. The field oxide 204 can be thick enough and the body implantation energy low enough so that the body region implants do not penetrate the epitaxial layer 200 in the edge region 203 where the field oxide 204 is present.

FIG. 5J shows the semiconductor device after an optional third resist mask 220 is formed to protect some of the body regions 218. The third mask 220 is patterned to define locations of the source regions.

FIG. 5K shows the semiconductor device during implantation of the source regions 222 into the body regions 218 which are unprotected by the third mask 220. A dopant species of the same conductivity as the epitaxial layer 200 is used to form the source regions 222. The source implantation process is indicated by downward facing arrows in FIG. 5K. The field oxide 204 can be thick enough and the source implantation energy low enough so that the source region implants do not penetrate the epitaxial layer 200 where the field oxide 204 is present, e.g. in the edge region 203 of the device. Also the gate polysilicon region 212 can be thick enough and the source implantation energy low enough so that the source region implants do not penetrate the epitaxial layer 200 where the polysilicon layer 212 is present.

FIG. 5L shows the semiconductor device after the third mask 220 is removed, annealing is performed to activate and diffuse the source regions 222, formation of an isolation layer 228 such as BPSG (borophosphosilicate glass) occurs on the field and gate oxides 204, 210, and formation of a fourth resist mask 230 occurs on the isolation layer 228. The fourth mask 230 is patterned to define locations of contact grooves in the source/body regions 222, 218.

FIG. 5M shows the semiconductor device after the contact grooves 232 are etched through the unmasked source regions 222 and into the body regions 218. According to one embodiment contacts to the gate conductors 212 are formed concurrently, for example in a separate region of the device where the polysilicon is preferentially located over the field oxide 204. According to a further embodiment contacts to the gate conductors 212 are formed using a separate contact etch process, for example in the DMOS cell area 205. In either case, the grooves 232 are narrower than the body regions 218 as previously described herein.

FIG. 5N shows the semiconductor device after the fourth mask 230 is removed and dopant species of the same conductivity type as the body regions 218 are implanted into the body regions 218 at the bottom of the grooves 232 to form source/body contact regions 234. Alternatively the body contact regions 218 can be implanted with the resist mask 230 still in place. The body contact implantation process is indicated by downward facing arrows in FIG. 5N. The implanted body contact regions 234 at the bottom of the grooves 232 can be amorphous due to the implantation process. The field oxide 204 can be thick enough and the body contact implantation energy low enough so that the body contact implants do not penetrate into the epitaxial layer 200 where the field oxide 204 is present, e.g. in the edge region 203 of the device.

FIG. 5O shows the semiconductor device after dopant species of the same conductivity type as the body regions 218 are implanted through the body regions 218 and into the underlying epitaxial layer 200 through the grooves 232, and the epitaxial layer 200 is annealed or diffused to form charge compensation regions 236 from the implants in the edge and DMOS cell regions 203, 205 of the device. The charge compensation implantation process is indicated by downward facing arrows in FIG. 5O. Removing the fourth mask 230 before implanting the charge compensation dopant species into the epitaxial layer 200 under the body regions 218 reduces the scattering of the charge compensation implant. Alternatively the mask 230 can be left in place so that higher energy implants can be masked for higher voltage variants. The dopant species can be implanted at an angle. In one embodiment, the dopant species used to form the charge compensation regions 236 is implanted after the implanted body contact regions 234 are formed and without an intermediate anneal. By doing so, the body contact regions 234 remain amorphous during the charge compensation implantation process which reduces vertical channeling during ion implantation.

The charge compensation implantation energy depends on several factors, including the depth of the body regions 218 and the breakdown voltage required. For example, implantation energy of about 125 keV can be used for a 40V application and medium depth body regions 218. Implantation energy of about 275 keV can be used for a 40V application and deep body regions 218. Implantation energy of about 450 keV can be used for a 40V application and double-diffused body regions 218. Still other implantation energies or a combination of one or more different implantation energies can be used.

In general, the charge compensation implantation parameters (e.g. energy and/or dose) can be determined or adjusted based on the results of one or more inline process measurements. For example, a measurement of the groove 232 dimensions (width and/or depth) and/or a measurement of the epitaxial layer 200 doping can be used to adjust the energy and/or dose of the charge compensation implantation process.

The charge compensation implantation process yields implant tails which extend to the main surface 209 of the epitaxial layer 200. The implant tails are graphically illustrated as dashed elongated ovals in FIG. 5O. The annealing process used to activate the dopants of the charge compensation regions 236 stops before the implant tails are driven under the source region 222. In one embodiment, rapid thermal annealing (RTA) is employed to fully activate the implanted dopant species without diffusing the implanted dopant species. However, some outward lateral diffusion of the implanted dopant species is permitted. In general, the charge compensation regions 236 extend in a direction parallel to the main surface 209 of the epitaxial layer 200 and terminate prior to a pn-junction 238 between the source region 222 and the body region 218 at the main surface 209 of the epitaxial layer 200. In one embodiment, the charge compensation regions 236 do not extend under the gate conductor 212. Such a device configuration improves the Vth distribution of the DMOS cells. In another embodiment the charge compensation regions 236 terminate prior to a pn-junction 238 between the source region 222 and the body region 218 at the main surface 209. This avoids lateral current flow under the source region 222 during avalanche, and avoids turn-on of the intrinsic parasitic bipolar transistor formed by the source region 222, body region 218 and underlying epitaxial layer 200.

Grooves 240 can also be formed in the thick field oxide layer 204 as previously described herein. These grooves 240 extend into the field oxide 204 toward the main surface 209 of the epitaxial layer 200 in the edge region 203 of the semiconductor device. During the compensation region implantation process, additional charge compensation regions 236 of the opposite conductivity type as the epitaxial layer 200 are formed in the epitaxial layer 200 by ion implantation under and aligned with the grooves 240 in the field oxide 204. These additional charge compensation regions 236 do not extend as deep into the epitaxial layer 200 as the charge compensation regions 236 formed in the DMOS cell region 205.

FIG. 5P shows the semiconductor device after a metal system 242 such as Ti, TiN, W, and/or AlCu is deposited over the structure, and a fifth resist mask 244 is formed on the metal system 242. The metal system 242 forms source/body contacts with the DMOS cells. The fifth mask 244 is patterned to define locations where the metal system 242 is to be removed.

FIG. 5Q shows the semiconductor device after the unmasked part of the metal system 242 is removed, e.g. by etching, and the fifth mask 244 is removed.

FIG. 5R shows the semiconductor device after a polymer 246, such as an imide, is formed on the structure. Other materials instead may be used, such as a nitride and/or oxide, e.g. in the case multiple wiring levels are provided. The charge compensation regions 236 in the edge and DMOS cell regions 203, 205 of the device bring the off-state depletion region to the main surface 209 of the epitaxial layer 200 in the edge region 203 as indicated by the dashed line in FIG. 5R, as previously described herein.

Figure 6:
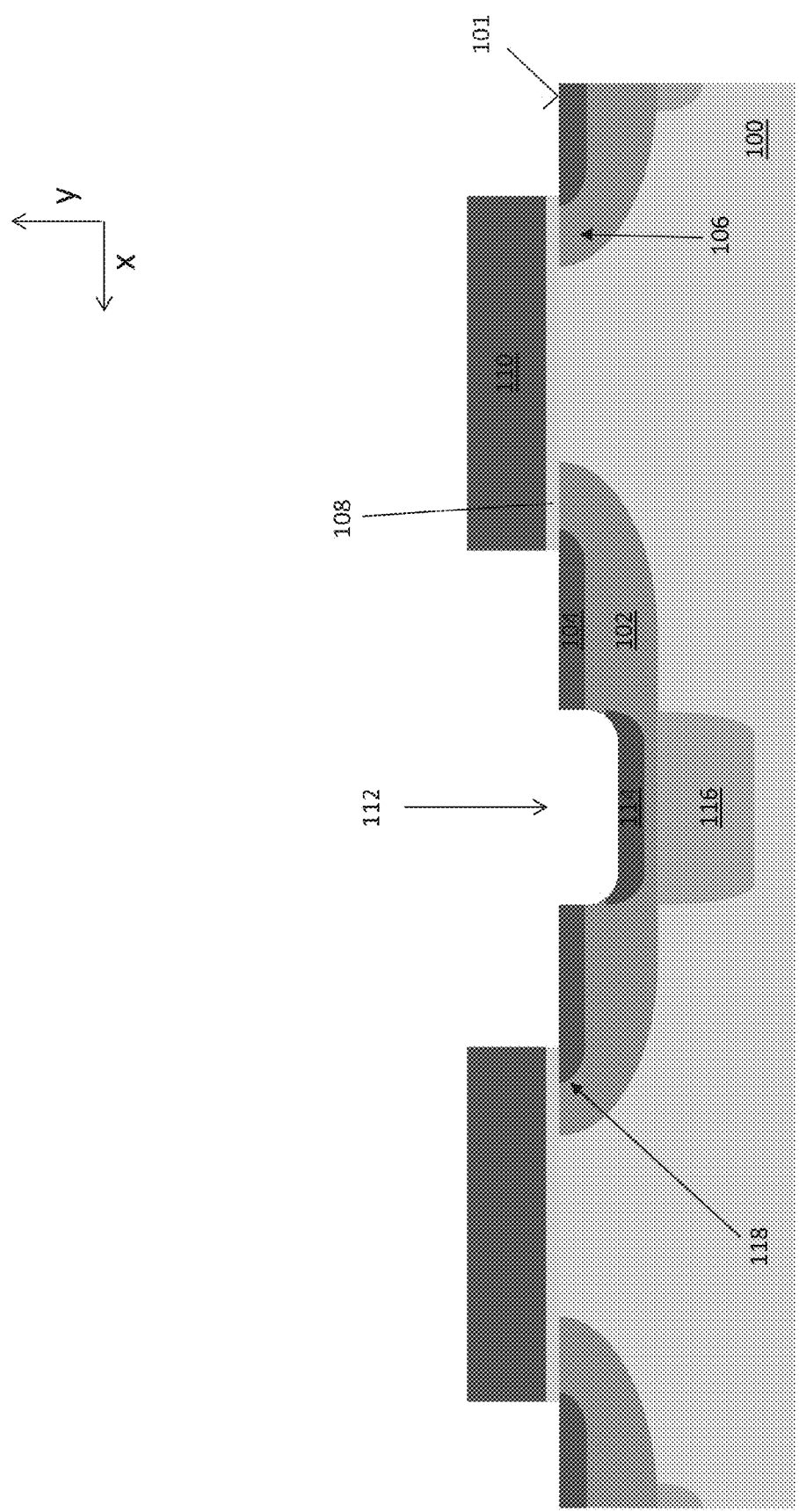
FIG. 6 illustrates a cross-sectional view of an embodiment of a semiconductor device having a charge compensation region aligned with a groove in the body region.

FIG. 6 illustrates a cross-sectional view of another embodiment of a DMOS semiconductor device prior to source/body contact formation. The embodiment shown in FIG. 6 is similar to the one shown in FIG. 1, however, no JFET region is provided according to this embodiment. To realize such a device, the JFET implantation process previously described herein with reference to FIG. 5D can be skipped. The semiconductor device still has charge compensation regions 116 of the opposite conductivity type as the epitaxial layer 100 disposed under the body region 102 and which are aligned with contact grooves 112 in the source/body regions 104, 102 according to this embodiment. The charge compensation regions 116 extend in a direction (x) parallel to the main surface 101 of the epitaxial layer 100 and terminate prior to a pn-junction 118 between the source region 104 and the body region 102 at the main surface 101 as previously described herein.

Figure 7:
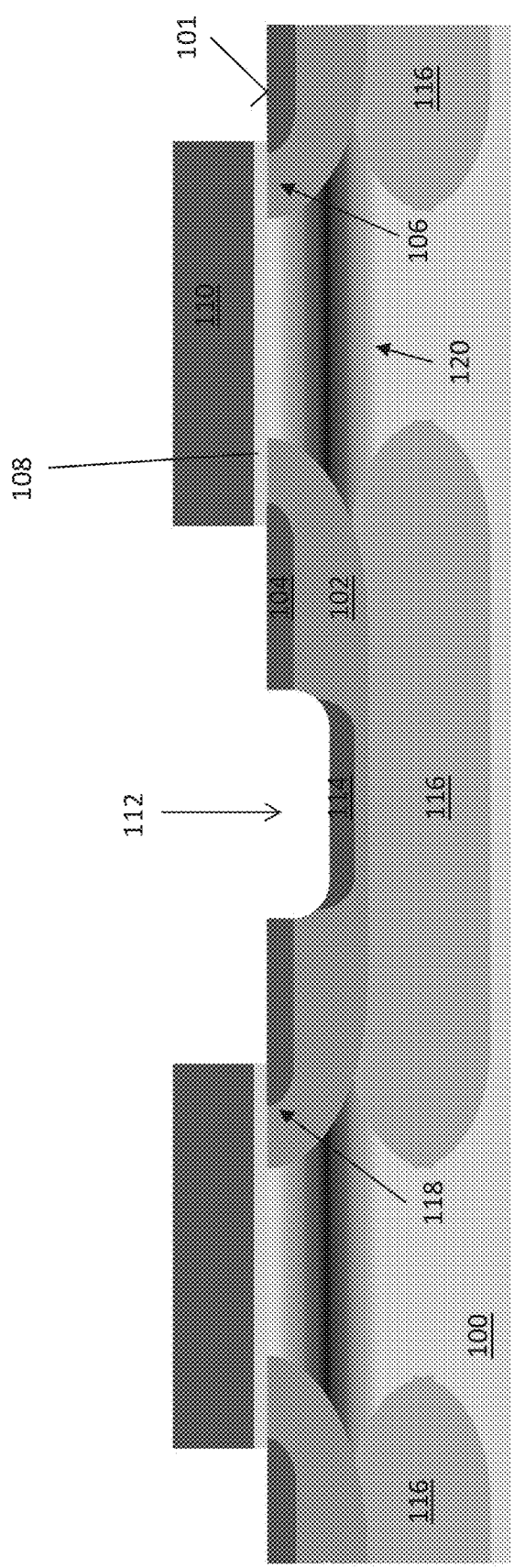
FIG. 7 illustrates a cross-sectional view of an embodiment of a semiconductor device having a charge compensation region and a JFET region in the drain/drift region of the device.

FIG. 7 illustrates a cross-sectional view of yet another embodiment of a DMOS semiconductor device prior to source/body contact formation. The embodiment shown in FIG. 7 is similar to the one shown in FIG. 1, however, the charge compensation regions 116 extend laterally under the pn-junction 118 between the source region 104 and the body region 102 and also extend under the gate conductor 110. The charge compensation regions 116 can be formed through the source/body grooves 112 as previously described herein, but annealed long enough so that they extend under the pn-junction 118 and gate conductor 110 as shown in FIG. 7. Alternatively, conventional methods can be employed to form the charge compensation regions 116.

In either case, JFET regions 120 are provided according to this embodiment. The JFET regions are disposed deep enough below the main surface 101 of the epitaxial layer 100 so that the JFET regions 120 do not reach the main surface 101. In one embodiment, the JFET regions 120 have a single peak doping concentration and a doping profile which is substantially the same above and below the single peak doping concentration. In another embodiment, the JFET regions 120 have multiple peak doping concentrations each of which is disposed deep enough below the main surface 101 of the epitaxial layer 100 so that the JFET regions 120 do not reach the main surface 101. Such JFET regions 120 can be formed by multiple implants at different energies, and are represented by the graded region 120 shown in FIG. 7.

In each case, a far lower Ron is possible by combining much shorter gate lengths with shallow and narrow charge compensation implants. Shallower charge compensation implants are compatible with thinner resist which can be patterned finely enough to produce the required short gate lengths, even when a JFET implant is added which further reduces the optimum gate length. The combination of charge compensation regions implanted through contact holes in the source/body regions of a semiconductor device and a JFET implant between the semiconductor surface and these regions produces a low-cost planar semiconductor device with low Ron, high breakdown voltage, and unaltered Vth.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    an epitaxial layer of semiconductor material of a first conductivity type having a main surface;
    a body region of a second conductivity type opposite the first conductivity type extending into the epitaxial layer from the main surface;
    a source region of the first conductivity type disposed in the body region;
    a channel region extending laterally in the body region from the source region along the main surface of the epitaxial layer;
    a charge compensation region of the second conductivity type disposed under the body region; and
    an additional region of the first conductivity type disposed in the epitaxial layer adjacent the body region, the additional region having at least one peak doping concentration each of which occurs deeper in the epitaxial layer from the main surface than a peak doping concentration of the channel region.

2. The semiconductor device according to claim 1, further comprising a gate dielectric disposed on the main surface of the epitaxial layer and a gate conductor disposed on the gate dielectric, wherein the gate dielectric has the same thickness over the additional region and the channel region.

3. The semiconductor device according to claim 1, wherein the additional region is disposed deep enough below the main surface of the epitaxial layer so that the additional region does not reach the main surface.

4. The semiconductor device according to claim 1, wherein the additional region has a single peak doping concentration and a doping profile of the additional region is substantially the same above and below the single peak doping concentration.

5. The semiconductor device according to claim 1, wherein the charge compensation region extends in a direction parallel to the main surface of the epitaxial layer and terminates prior to a pn-junction between the source region and the body region at the main surface.

6. A method of manufacturing a semiconductor device, the method comprising:
    forming an epitaxial layer of semiconductor material of a first conductivity type having a main surface;
    forming a body region of a second conductivity type opposite the first conductivity type which extends into the epitaxial layer from the main surface;
    forming a source region of the first conductivity type in the body region;
    forming a channel region which extends laterally in the body region from the source region along the main surface of the epitaxial layer;
    forming a charge compensation region of the second conductivity type under the body region; and
    forming an additional region of the first conductivity type in the epitaxial layer adjacent the body region, the additional region having at least one peak doping concentration each of which occurs deeper in the epitaxial layer from the main surface than a peak doping concentration of the channel region.

7. The method according to claim 6, further comprising forming a gate dielectric on the main surface of the epitaxial layer and a gate conductor on the gate dielectric, the gate dielectric having the same thickness over the additional region and the channel region.

8. The method according to claim 6, wherein forming the additional region comprises:
    implanting a dopant species of the first conductivity type into an active device region of the epitaxial layer at an implantation energy sufficient to yield a single peak concentration level of the implanted dopant species deep enough below the main surface of the epitaxial layer so that the additional region does not reach the main surface once formed; and
    diffusing the implanted dopant species to form the additional region which does not reach the main surface.

9. The method according to claim 6, wherein forming the additional region comprises:
    implanting a dopant species of the first conductivity type into an active device region of the epitaxial layer at an implantation energy sufficient to yield a single peak concentration level of the implanted dopant species at a depth below the main surface of the epitaxial layer; and
    diffusing the implanted dopant species to form the additional region with substantially the same doping profile above and below the single peak doping concentration level.

10. The method according to claim 6, wherein forming the charge compensation region comprises:
    forming a mask with an opening over the source region;
    etching a groove through the source region into the body region via the opening in the mask;
    implanting a dopant species of the second conductivity type into the epitaxial layer under the body region via the groove; and
    thermally treating the epitaxial layer to form the charge compensation region.

11. A semiconductor device, comprising:
    an epitaxial layer of semiconductor material of a first conductivity type having a main surface;
    a body region of a second conductivity type opposite the first conductivity type extending into the epitaxial layer from the main surface;
    a source region of the first conductivity type disposed in the body region;
    a groove extending from the main surface of the epitaxial layer through the source region into the body region, the groove being narrower than the body region; and
    a charge compensation region of the second conductivity type disposed under the body region in alignment with the groove, the charge compensation region extending in a direction parallel to the main surface of the epitaxial layer and terminating prior to a pn-junction between the source region and the body region at the main surface.

12. The semiconductor device according to claim 11, further comprising a gate dielectric disposed on the main surface of the epitaxial layer and a gate conductor disposed on the gate dielectric, wherein the charge compensation region does not extend under the gate conductor.

13. The semiconductor device according to claim 11, further comprising:
    a thick oxide disposed on the main surface of the epitaxial layer in an edge region of the semiconductor device, such that the silicon region under the thick oxide is devoid of the source and body regions;

grooves extending into the thick oxide toward the main surface of the epitaxial layer; and additional charge compensation regions of the second conductivity type disposed in the epitaxial layer under and aligned with the grooves in the thick oxide.

14. The semiconductor device according to claim 13, wherein the additional charge compensation regions are arranged in a checkerboard pattern.

15. The semiconductor device according to claim 13, wherein the additional charge compensation regions are formed as stripes disposed at an angle with respect to the charge compensation region under the body region.

16. The semiconductor device according to claim 11, further comprising:
a channel region extending laterally in the body region from the source region along the main surface of the epitaxial layer; and
an additional region of the first conductivity type disposed in the epitaxial layer adjacent the body region, the additional region having at least one peak doping concentration each of which occurs deeper in the epitaxial layer from the main surface than a peak doping concentration of the channel region.

17. A method of manufacturing a semiconductor device, the method comprising:
forming an epitaxial layer of semiconductor material of a first conductivity type having a main surface;
forming a body region of a second conductivity type opposite the first conductivity type which extends into the epitaxial layer from the main surface;
forming a source region of the first conductivity type in the body region;
forming a groove extending from the main surface of the epitaxial layer through the source region into the body region, the groove being narrower than the body region; and
forming a charge compensation region of the second conductivity type under the body region in alignment with the groove, the charge compensation region extending in a direction parallel to the main surface of the epitaxial layer and terminating prior to a pn-junction between the source region and the body region at the main surface.

18. The method according to claim 17, further comprising:
forming a thick oxide on the main surface of the epitaxial layer in an edge region of the semiconductor device, such that the silicon region under the thick oxide is devoid of the source and body regions;
forming grooves which extend into the thick oxide toward the main surface of the epitaxial layer; and
forming additional charge compensation regions of the second conductivity type in the epitaxial layer under and aligned with the grooves in the thick oxide.

19. The method according to claim 18, further comprising:
forming a gate dielectric on the main surface of the epitaxial layer and a gate conductor on the gate dielectric; and
forming a contact to the gate conductor in a region where the gate conductor is located over the thick oxide.

20. The method according to claim 17, wherein forming the groove and the charge compensation region comprises:
forming a mask on the epitaxial layer with an opening over the source region;
etching the groove through the source region into the body region via the opening in the mask;
implanting a dopant species of the second conductivity type into the epitaxial layer under the body region via the groove; and
thermally treating the implant to form the charge compensation region.

21. The method according to claim 20, wherein the thermal treatment includes rapid thermal annealing to activate the implanted dopant species without redistributing the implanted dopant species.

22. The method according to claim 20, wherein the dopant species is implanted at an angle.

23. The method according to claim 20, further comprising implanting dopant species of the second conductivity type into the body region via the opening in the mask to form an implanted body contact region prior to implanting the dopant species used to form the charge compensation region, and wherein the dopant species used to form the charge compensation region is implanted after the implanted body contact region is formed and without an intermediate anneal.

24. The method according to claim 20, wherein the implanting of the dopant species yields implant tails which extend to the main surface of the epitaxial layer, and wherein the thermal treatment is performed so that the implant tails are not driven under the source region.

25. The method according to claim 20, wherein forming the mask with an opening over the source region comprises:
forming an insulator on the main surface of the epitaxial layer and a resist on the insulator;
patterning the resist to form the opening in the insulator; and
removing the resist after the opening is formed in the insulator and before the dopant species is implanted into the epitaxial layer under the body region via the opening in the insulator.

26. The method according to claim 20, wherein forming the mask with an opening over the source region comprises:
forming an insulator on the main surface of the epitaxial layer and a resist on the insulator;
patterning the resist to form the opening in the insulator; and
leaving the resist in place after the opening is formed in the insulator and before the dopant species is implanted into the epitaxial layer under the body region via the opening in the resist and insulator.

27. The method according to claim 17, further comprising:
forming a channel region which extends laterally in the body region from the source region along the main surface of the epitaxial layer; and
forming an additional region of the first conductivity type in the epitaxial layer adjacent the body region, the additional region having at least one peak doping concentration each of which occurs deeper in the epitaxial layer from the main surface than a peak doping concentration of the channel region.

28. The method according to claim 27, wherein forming the charge compensation region comprises:
implanting a dopant species of the second conductivity type into the epitaxial layer under the body region via an opening in a mask which exposes the groove, the implanting of the dopant species yielding implant tails which extend to the main surface of the epitaxial layer; and
annealing the implanted dopant species to form the charge compensation region and so that the implant tails are not driven into the channel region.

* * * * *